US009274327B2

(12) United States Patent
Schicketanz et al.

(10) Patent No.: US 9,274,327 B2
(45) Date of Patent: Mar. 1, 2016

(54) CATADIOPTRIC PROJECTION OBJECTIVE COMPRISING DEFLECTION MIRRORS AND PROJECTION EXPOSURE METHOD

(71) Applicant: Carl Zeiss SMT GmbH, Oberkcohen (DE)

(72) Inventors: Thomas Schicketanz, Aalen (DE); Toralf Gruner, Aalen-Hofen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 14/522,917

(22) Filed: Oct. 24, 2014

(65) Prior Publication Data

US 2015/0062725 A1 Mar. 5, 2015

Related U.S. Application Data

(63) Continuation of application No. 13/431,681, filed on Mar. 27, 2012, now Pat. No. 8,896,814, which is a continuation of application No. PCT/EP2010/005683, filed on Sep. 16, 2010.

(30) Foreign Application Priority Data

Sep. 29, 2009 (DE) .......................... 10 2009 048 553

(51) Int. Cl.
*G03B 27/54* (2006.01)
*G03B 27/42* (2006.01)
(Continued)

(52) U.S. Cl.
CPC ............... *G02B 17/08* (2013.01); *G02B 13/14* (2013.01); *G02B 17/0892* (2013.01); *G03F 1/26* (2013.01);
(Continued)

(58) Field of Classification Search
CPC ..................... G03F 7/70225; G03F 7/70275
USPC ................... 355/52, 53, 67–71; 359/351, 364
See application file for complete search history.

(56) References Cited

U.S. PATENT DOCUMENTS

| | | | |
|---|---|---|---|
| 6,104,472 | A | 8/2000 | Suzuki |
| 6,310,905 | B1 | 10/2001 | Shirai |

(Continued)

FOREIGN PATENT DOCUMENTS

| | | |
|---|---|---|
| CN | 100483174 C | 4/2009 |
| DE | 102 40 598 | 3/2004 |

(Continued)

OTHER PUBLICATIONS

Ikezawa et al., "A Hyper-NA Projection Lens for ArF Immersion Exposure Tool," Optical Microlithography XIX, edited by Donis G. Flagello, Proc. of SPIE vol. 6154 615421, (2006).

(Continued)

*Primary Examiner* — Hung Henry Nguyen
(74) *Attorney, Agent, or Firm* — Fish & Richardson P.C.

(57) ABSTRACT

A catadioptric projection objective has a multiplicity of lenses and at least one concave mirror, and also two deflection mirrors in order to separate a partial beam path running from the object field to the concave mirror from the partial beam path running from the concave mirror to the image field. The deflection mirrors are tilted relative to the optical axis of the projection objective about tilting axes running parallel to a first direction (x-direction). The first deflection mirror is arranged in optical proximity to a first field plane and the second deflection mirror is arranged in optical proximity to a second field plane, which is optically conjugate with respect to the first field plane. A displacement device for the synchronous displacement of the deflection mirrors is provided. The deflection mirrors have different local distributions of their reflection properties in first and second reflection regions, respectively.

23 Claims, 10 Drawing Sheets

(51) Int. Cl.
*G02B 17/08* (2006.01)
*G02B 13/14* (2006.01)
*G03F 7/20* (2006.01)
*G03F 1/26* (2012.01)

(52) U.S. Cl.
CPC ............ *G03F 7/702* (2013.01); *G03F 7/70225* (2013.01); *G03F 7/70258* (2013.01); *G03F 7/70275* (2013.01); *G03F 7/70308* (2013.01)

(56) References Cited

U.S. PATENT DOCUMENTS

| | | | |
|---|---|---|---|
| 6,552,775 | B1 | 4/2003 | Yanagihara et al. |
| 6,853,441 | B2 | 2/2005 | Kobayashi et al. |
| 7,271,876 | B2 | 9/2007 | Ulrich et al. |
| 7,362,508 | B2 | 4/2008 | Omura et al. |
| 7,583,433 | B2 * | 9/2009 | Antoni ............... G02B 17/0621 359/351 |
| 7,583,443 | B2 | 9/2009 | Zaczek |
| 8,027,088 | B2 | 9/2011 | Mueller et al. |
| 8,107,162 | B2 * | 1/2012 | Dodoc .................. G02B 17/08 359/364 |
| 8,896,814 | B2 | 11/2014 | Schicketanz et al. |
| 2002/0171952 | A1 | 11/2002 | Weber et al. |
| 2003/0147150 | A1 | 8/2003 | Kohl et al. |
| 2005/0190446 | A1 | 9/2005 | Kuerz et al. |
| 2005/0254120 | A1 | 11/2005 | Zaczek et al. |
| 2006/0077366 | A1 | 4/2006 | Shafer et al. |
| 2006/0134785 | A1 | 6/2006 | Fernandez et al. |
| 2007/0165202 | A1 | 7/2007 | Koehler |
| 2008/0068576 | A1 | 3/2008 | Omura et al. |
| 2008/0158665 | A1 | 7/2008 | Mueller et al. |
| 2008/0304036 | A1 | 12/2008 | Omura |
| 2009/0034061 | A1 | 2/2009 | Dodoc |
| 2009/0042139 | A1 | 2/2009 | Shiraishi et al. |
| 2011/0304926 | A1 | 12/2011 | Mueller et al. |
| 2012/0162625 | A1 | 6/2012 | Dodoc et al. |
| 2012/0236277 | A1 | 9/2012 | Schicketanz et al. |

FOREIGN PATENT DOCUMENTS

| | | |
|---|---|---|
| DE | 10 2004 026 518 | 12/2004 |
| DE | 10 2004 026 518 A1 | 12/2005 |
| EP | 1 001 295 | 5/2000 |
| EP | 0 851 304 B1 | 3/2004 |
| EP | 1 751 601 B1 | 12/2007 |
| EP | 1 983 362 | 10/2008 |
| JP | 2005-140999 A | 6/2005 |
| JP | 2005-537676 A | 12/2005 |
| TW | 466585 | 12/2001 |
| TW | 200303447 A | 9/2003 |
| TW | 200730869 A | 8/2007 |
| TW | 200905409 A | 2/2009 |
| WO | WO 2004/019128 | 3/2004 |
| WO | WO 2004/025370 | 3/2004 |
| WO | WO 2004/090600 A2 | 10/2004 |
| WO | WO 2005/026843 A2 | 3/2005 |
| WO | WO 2008/080534 | 7/2008 |

OTHER PUBLICATIONS

The International Search Report and a Written Opinion from the counterpart PCT Application No. PCT/EP2010/005683, dated Feb. 7, 2011.
German Office Action, with English translation, for corresponding DE Appl No. 10 2009 048 553.8, dated Mar. 11, 2010.
Taiwanese Office Action, with translation thereof, for corresponding TW Appl No. 099132753, issued Oct. 4, 2013.
English Summary of Office Action for corresponding TW Appl No. 099132753.
Chinese Office Action, with translation thereof, for CN Appl No. 201080053872.4, issued Feb. 8, 2014.

* cited by examiner

CATADIOPTRIC PROJECTION OBJECTIVE COMPRISING DEFLECTION MIRRORS AND PROJECTION EXPOSURE METHOD

CROSS-REFERENCE TO RELATED APPLICATIONS

This application is a continuation of, and claims benefit under 35 USC 120 to, U.S. application Ser. No. 13/431,681, filed Mar. 27, 2012, which is a continuation of, and claims benefit under 35 USC 120 to, international application PCT/EP2010/005683, filed Sep. 16, 2010, which claims benefit under 35 USC 119 of German Application No. 10 2009 048 553.8, filed Sep. 29, 2009. U.S. application Ser. No. 13/431, 681, international application PCT/EP2010/005683 and German Application No. 10 2009 048 553.8 are hereby incorporated by reference in their entirety.

The disclosure relates to a catadioptric projection objective for imaging a pattern of a mask arranged in an object field of an object surface of the projection objective into an image field arranged in the image surface of the projection objective, and to a projection exposure method which can be carried out with the aid of the projection objective.

Microlithographic projection exposure methods are predominantly used nowadays for producing semiconductor components and other finely patterned components. These methods involve the use of masks (reticles) that bear the pattern of a structure to be imaged, e.g. a line pattern of a layer of a semiconductor component. A mask is positioned into a projection exposure apparatus between an illumination system and a projection objective in the region of the object surface of the projection objective and is illuminated with an illumination radiation provided by the illumination system in the region of the effective object field. The radiation altered by the mask and the pattern passes as a projection radiation beam through the projection objective, which images the pattern of the mask onto the substrate to be exposed, in the region of the effective image field, which is optically conjugate with respect to the effective object field. The substrate normally bears a layer sensitive to the projection radiation (photoresist).

One of the aims in the development of projection exposure apparatuses is to produce structures having increasingly smaller dimensions on the substrate using lithography. Smaller structures lead to higher integration densities e.g. in the case of semiconductor components, which generally has a favourable effect on the performance of the microstructured components produced.

The size of the structures that can be produced depends on the resolving power of the projection objective used and can be increased firstly by reducing the wavelength of the projection radiation used for projection, and secondly by increasing the image-side numerical aperture NA of the projection objective that is used in the process.

In the past, purely refractive projection objectives (also referred to as "dioptric" or simply "refractive" projection objectives) have predominantly been used for optical lithography. In the case of a dioptric projection objective, all of the optical elements which have a refractive power are refractive elements (lenses). In the case of dioptric systems, however, the correction of elementary imaging aberrations, such as, for example, the correction of chromatic aberrations and the correction of the image field curvature, becomes more difficult as the numerical aperture increases and the wavelength decreases.

One approach for obtaining a planar image surface and a good correction of chromatic aberrations consists in using catadioptric projection objectives, which contain both refractive optical elements having a refractive power, that is to say lenses, and refractive elements having a refractive power, that is to say curved mirrors. At least one concave mirror is typically contained. While the contributions of lenses having a positive refractive power and lenses having a negative refractive power in an optical system to the total refractive power, to the image field curvature and to the chromatic aberrations are respectively in opposite senses, a concave mirror has a positive refractive power just like a positive lens, but an opposite effect on the image field curvature by comparison with a positive lens. Moreover, concave mirrors do not introduce chromatic aberrations.

It is not easy to integrate a concave mirror into an optical imaging system, in particular into a projection objective for microlithographic projection exposure methods, since it reflects the radiation back substantially in the direction from which the radiation is incident. There are numerous proposals for integrating concave mirrors into an optical imaging system in such a way that neither problems with beam vignetting nor problems with pupil obscuration occur. For this purpose, a group of catadioptric projection objectives uses two deflection mirrors in order to separate the partial beam path running from the object field to the concave mirror from the partial beam path running from the concave mirror to the image field. A subgroup of such projection objectives contains a first deflection mirror for deflecting the radiation coming from the object surface to the concave mirror and a second deflection mirror for deflecting the radiation coming from the concave mirror in the direction of the image surface. If the mirror surfaces of the deflection mirrors are oriented perpendicularly to one another, then the object plane and image plane of the projection objective can be oriented parallel to one another.

Some types of such projection objectives are composed of two imaging objective parts connected in series and have a single real intermediate image between the object plane and image plane (see e.g. US 2006/0077366 A1 and WO 2004/09060 A2).

In other types, three imaging objective parts connected in series are present, with the result that exactly two real intermediate images are generated (see e.g. WO 2004/019128 A1 corresponding to U.S. Pat. No. 7,362,508 B2 or EP 1 751 601 B1).

The patent application US 2005/0254120 A1 discloses examples of systems with one intermediate image in which the reflection coatings of the deflection mirrors are optimized with regard to certain aspects of the polarization-dependent reflectivity.

The patent application WO 2008/080534 A1 discloses examples of projection objectives with two intermediate images in which the reflection coatings of the deflection mirrors are optimized with regard to certain aspects of the polarization-dependent reflectivity.

The patent applications US 2002/0171952 A1 or US 2003/0147150 describe structural partial aspects of projection objectives comprising two deflection mirrors which are oriented perpendicularly to one another and which are fitted to a common carrier and can accordingly be tilted jointly in a simple manner.

Besides the intrinsic imaging aberrations which a projection objective can have on account of the production thereof, imaging aberrations can also occur during the period of use of the projection objective, in particular during the operation of the projection exposure apparatus. Such imaging aberrations are often caused by alterations of the optical elements incorporated in the projection objective as a result of the projection radiation used in the course of utilization. By way of example, a certain part of the projection radiation can be absorbed by the optical elements in the projection objective, wherein the extent of the absorption is dependent, inter alia, on the material used for the optical elements, for example the lens material, the mirror material and/or the properties of antireflection coating or reflection coatings possibly provided. The absorption of the projection radiation can lead to heating of the optical elements, as a result of which, in the optical elements, a surface deformation and, in the case of refractive elements, a change in refractive index can be brought about directly and indirectly using thermally induced mechanical stresses. Changes in refractive index and surface deformations lead, in turn, to alterations of the imaging properties of the individual optical elements and hence also of the projection objective overall. This problem area is often dealt with under the keywords "lens heating". Other imaging aberrations that arise during the use of the projection objective, for example on account of aging effects, can also occur.

During the design of a lithography process, line widths of the structures on the reticle are adapted in such a way that, after imaging with the aid of the projection objective using a predeterminable illumination, the desired structure sizes are exposed in the light-sensitive layer. In this case, it is important that identical structures of the mask be imaged identically in the photoresist independently of the location on the substrate. Otherwise, in the case of semiconductor components, speed losses or in the worst case even functional losses can occur. One critical parameter in semiconductor production, therefore, is the change in thickness of the critical structures (CD) brought about by the process, this also being referred to as "variation of the critical dimensions" or "CD variation". Accordingly, a uniform width of imaged identical structures over the field, the so-called CD uniformity, constitutes an essential quality criterion of lithography processes.

A determining factor for the width of a structure in the photoresist is the radiation energy deposited there. To a normal approximation it is assumed that the photoresist is exposed above a specific quantity of radiation energy deposited, and is not exposed below this quantity. The limit value for the quantity of radiation energy is also referred to as "resist threshold". What is important here is the radiation intensity integrated during a total exposure time at a location of the substrate. The magnitude of the radiation energy deposited at a specific location in the photoresist is dependent on a multiplicity of influencing parameters, inter alia on optical aberrations, in particular on chromatic aberrations, on the polarization state of the exposure radiation and also on the influence of stray light and double reflections. A further important parameter is the so-called field uniformity, which is a measure of the uniformity of the radiation energy distribution over the effective image field used during the exposure process. In the case of inadequate field uniformity, different regions of the substrate exposed in the effective image field are subjected to different levels of the irradiation energy, as a result of which, in general, the CD variation is adversely influenced.

Attempts are usually made to at least partly compensate for heat-induced imaging aberrations, or other imaging aberrations that occur during the service life, by using active manipulators. Active manipulators are generally optomechanical devices that are designed to act, on account of corresponding control signals, on individual optical elements or groups of optical elements in order to alter the optical effect thereof in such a way that an aberration that occurs is at least partly compensated for. For this purpose, provision may be made, for example, for altering or deforming individual optical elements or groups of optical elements with regard to their position. The compensation of imaging aberrations that occur in a time-dependent manner by manipulators generally requires a considerable additional outlay in respect of apparatus, which can lead to significantly higher production costs.

Consequently, there is a need for active manipulators that can be provided in a relatively cost-effective manner.

SUMMARY

Disclosed embodiments feature catadioptric projection objectives that include deflection mirrors wherein a high imaging quality can be ensured using structurally relatively simple measures over the lifetime of the projection objective, in particular including during the operation of the projection exposure apparatus. Furthermore, in certain embodiments, a projection exposure method wherein imaging aberrations that occur in a time-dependent manner during operation can be compensated for rapidly and precisely in a field-dependent manner.

In some embodiments, a synchronous, linear displaceability of the deflection mirrors in conjunction with special features in the case of the non-constant local distribution of the reflection properties of the deflection mirrors affords a possibility for the active manipulation of imaging properties of the projection objective, without additional optical elements having to be introduced into the projection objective for this purpose.

In certain embodiments, if the optical imaging system arranged between the first field plane and the second field plane has in the first direction an imaging scale $\beta_x$ from the range $-0.8 > \beta_x > -1.2$, an effective correction with sufficient variability in the field is readily possible using simultaneous displacement of the deflection mirrors by displacement distances that are identical in terms of absolute value. If the condition $-0.9 > \beta_x > -1.1$ or even the condition $-0.95 > \beta_x > -1.05$ is met, then even field points that are very close together can be influenced in a targeted manner largely independently of one another. In the case of greater deviations from the imaging scale $\beta_x = -1$, it may be more expedient if the absolute values of the displacement distances in the case of synchronous displacement are different, which is possible, in principle, but may require additional structural outlay and additional outlay in respect of control engineering.

In principle, different reflection properties of the deflection mirrors can be varied locally in order to obtain a manipulator effect. In particular, a distinction can be made here between predominantly energetic reflection properties and predominantly geometric reflection properties.

In some embodiments, a desired local distribution of energetic reflection properties can be obtained primarily by providing reflection coatings whose reflectance varies locally over the mirror surface of a deflection mirror. The term reflectance (sometimes also referred to as reflectivity) here denotes the ratio between the intensity of the electromagnetic radiation reflected by a deflection mirror and the intensity of the electromagnetic radiation incident on the mirror. A specific local distribution of the reflectance can be obtained, in particular, using suitable layer thickness profiles of the reflection coating, that is to say using a local profile of the geometric layer thicknesses of individual or all layers of a reflection coating.

By contrast, a desired local distribution of geometric reflection properties of a deflection mirror can be set, in particular, using a suitable choice of the surface form of the mirror surface, that is to say using the so-called "figure profile". While a plane mirror in this connection has local constant geometric reflection properties with regard to an incident radiation beam, a displacement of mirror surfaces that are non-planar, i.e. uneven, in particular curved continuously in a defined manner, in the beam path can be used to alter the optical path lengths of individual rays on the optical path between object field and image field relative to other rays running from the object field to the image field, such that the wavefront of the radiation running through the projection objective can be influenced or manipulated in a targeted manner.

In real systems, these two effects generally cannot be completely separated from one another since, for example, the layer structure of a multilayered reflection coating can also have a certain influence on the wavefront of the reflected radiation, such that a reflection layer having a local profile of the reflectance can also influence the wavefront to a small extent.

The synchronous displacement of the deflection mirrors between the first position and the second position ensures that the rays of the projection radiation beam, on both deflection mirrors, impinge in different reflection regions in the second position compared with the case of the first position. Since, then, the deflection mirrors have different local distributions of their (geometric and/or energetic) reflection properties in the first and the second reflection regions, with regard to the reflection properties that have an effective role a differentiating effect arises in so far as the difference between the change at the first deflection mirror and the change at the second deflection mirror is effective for the total change in the beam influencing.

With the use of reflection layers having a layer thickness profile energetic parameters such as, for example, the field uniformity, can be altered in a targeted manner in order to reduce or to avoid for example CD variations in the structures produced lithographically. The influencing of the wavefront by suitable figure profiles of the mirror surfaces can likewise be used to optimize the imaging quality.

Some embodiments are distinguished by the fact that the first deflection mirror has a first reflection coating and the second deflection mirror has a second reflection coating, and the reflection coatings in each case have first layer regions having a first local distribution of the reflectance and, lying alongside the first layer regions in the first direction, second layer regions having a second local distribution of the reflectance, which differs from the first distribution of the reflectance in the first layer regions. The local variations of the reflectance can be obtained, in particular, using targeted changes in layer thickness of the reflection coatings over the optically usable mirror surface parallel to the first direction. As an alternative or in addition it is also possible to use layers having a locally varying neutral filter effect.

In some embodiments, the reflection coatings of the first deflection mirror and of the second deflection mirror in each case have a linear change in the layer thickness in the first direction, wherein the layer thickness change extends both over the first layer regions and over the second layer regions. It is generally simpler to produce linear layer thickness profiles than non-linear layer thickness profiles, which are likewise possible here and such linearly graded layers can be produced with higher quality. Such deflection mirrors can be used to obtain, for example, in a targeted manner, a tilting of the transmission profile of the projection objective in the first direction of the image field in order, for example, to at least partly compensate for a tilting in an opposite direction produced on account of other circumstances. Such tiltings of the transmission can arise here, for example, as a result of asymmetries in antireflection coatings within the projection objective.

It is also possible to cover the first layer regions in each case with reflection coatings having a locally constant reflectance and to provide a local layer thickness profile, for example a linear change in the layer thickness, in the second layer region lying alongside the first layer regions. In these cases, with synchronous displacement of the deflection mirrors parallel to the first direction, it is possible, in a targeted manner, to influence the energetic conditions at the field edges situated in the first direction in order, for example, to increase the associated transmission. This may be expedient for example when, in the case of lenses of the projection objective which are near the field, after relatively long operation, contaminants have diffused into the lenses via the edge and thereby reduce the transmission in the field edge region. This can be partly or wholly compensated for using the refractive manipulator.

It is also possible for a different local profile of the reflection properties to be provided on the first deflection mirror compared with that on the second deflection mirror, in order to correct a different type of aberration. By way of example, the first reflection layer can have a linear profile of the layer thicknesses (layer thickness tilt), while the second reflection layer has a quadratic layer thickness profile or layer thickness profile that varies in some other way according to a power law.

If the intention is to influence predominantly the wavefront of the projection radiation beam, embodiments may be advantageous wherein the first deflection mirror has a first non-planar mirror surface and the second deflection mirror has a second non-planar mirror surface having a surface form in the opposite direction relative to the first direction with respect to the first mirror surface.

In this case, the deviations of the non-planar mirror surfaces from a planar reference surface are significantly larger than the deviations which lie within the scope of the tolerances for plane mirrors; the latter deviations can be, for example, of the order of magnitude of one or several percent or one or several per mille of the projection radiation wavelength, e.g. between $\lambda/100$ and $\lambda/1000$. On the other hand, the deviations in the case of a planar reference surface should not be too large either, in order to avoid undesired distortions of the wavefront. The maximum deviations from a plane surface may be e.g. of the order of magnitude of one or a few micrometers, for example a maximum of 20 μm or a maximum of 10 μm.

In some embodiments, the first mirror surface and the second mirror surface have in the first direction in each case a simply curved, e.g. a parabolically curved, surface form. Curvatures according to other power laws or curvatures which follow a polynomial are also possible. More complex curvatures, for example with a change in the direction of curvature, may be advantageous in some cases. The surface form is generally dependent on the correction possibility mainly sought.

As long as the deflection mirrors are situated in the first position, the wavefront effects of the mirror surfaces of the first deflection mirror and of the second deflection mirror on the projection radiation reflected at them produce a specific net effect on the wavefront. This net effect can be calculated and compensated for during the production of the system by a correction elsewhere in the optical system, e.g. using an aspherical optical surface (lens surface or mirror surface) of a different optical element. Upon displacement of the deflection mirrors to the second position, this compensation is cancelled, and so a resultant wavefront effect, that is to say a desired alteration of the form of the wavefront, is achieved. The mode of action of this manipulator can in this respect be comparable to the mode of action of manipulators such as are described e.g. in EP 0 851 304 B1. Such manipulators are also known as "Alvarez elements". Whereas exclusively transparent elements are used to construct an Alvarez element in known systems, however, the present application proposes a reflective variant, which, in principle, can also be used in pure mirror systems, that is to say in a catoptric projection objective.

It is possible to apply reflection layers having locally varying reflection properties on the non-planar mirror surfaces, e.g. in order to optimize energetic properties in the first position (zero position). In general, however, it is possible to use reflection layers having locally constant reflection properties, which reflection layers can be produced in a relatively simple manner.

The first deflection mirror is intended to be arranged in optical proximity to a first field plane and the second deflection mirror in optical proximity to a second field plane, which is optically conjugate with respect to the first field plane. Preferably, the first deflection mirror and the second deflection mirror are arranged in a region in which a subaperture ratio S is less than 0.3, in particular less than 0.2, or even less than 0.1 in terms of the absolute value. This can ensure that the two deflection mirrors are to the greatest possible extent situated at optically equivalent positions near the field, such that the field profile of the imaging properties to be influenced (energetic and/or wavefront) can be set very precisely and differently in a targeted manner for closely adjacent field points.

If the displacement device has a displacement drive for the synchronous displacement of the first and of the second deflection mirror parallel to the first direction, the displacement drive being actuable during the operation of the projection objective, the abovementioned manipulations are possible during the operation of the projection exposure apparatus, at the installation location for the end users (for example a manufacturer of patterned semiconductor components). The displacement can be carried out for example temporally between two successive exposures or after the conclusion of one exposure series before the beginning of a new exposure series.

The first deflection mirror and the second deflection mirror can have mutually separate and, if appropriate, separately adjustable mounts. A synchronization of the displacement can be achieved by virtue of the first deflection mirror and the second deflection mirror having a common carrier structure. The deflection mirrors can be formed, in particular, by mirror surfaces of a carrier prism that are oriented perpendicularly to one another, such that a mutual relative displacement of the deflection mirrors is impossible and the desired relative orientation is readily maintained even in the case of displacement.

The manipulation possibility described here can be used in projection objectives of different constructions, in particular in projection objectives having at least one real intermediate image, e.g. in projection objectives having exactly one intermediate image or having exactly two intermediate images.

A projection objective having exactly one intermediate image can be constructed in such a way that the projection objective has a first objective part for imaging the object field into an intermediate image, wherein the concave mirror is arranged in the region of a first pupil surface lying between the object field and the intermediate image, and a second objective part for imaging the intermediate image into the image surface, the first deflection mirror is arranged in optical proximity to the object field and the second deflection mirror is arranged in optical proximity to the intermediate image. US 2006/0077366 A1 in the name of the applicant discloses examples of such projection objectives. A first deflection mirror is arranged in optical proximity to the object surface, and the second deflection mirror is situated directly downstream of the intermediate image. Projection objectives of the type shown in FIG. 4 or FIG. 6 of US 2006/0077366 A1 can also be equipped with a reflective manipulator of the type described in the present application. WO 2004/09060 A2 in the name of the applicant discloses further examples of projection objectives wherein a single intermediate image is formed between object surface and image surface. A polarization-selective physical beam splitter is used for separating the partial beam paths. A first deflection mirror is arranged in optical proximity to the object surface and is formed by the polarization-selective beam splitter surface which has a refractive effect for the radiation which comes from the object field and which is s-polarized with respect to the beam splitter surface. The second deflection mirror is situated directly upstream of the intermediate image.

A projection objective having more than one intermediate image can be constructed, for example, in such a way that the projection objective has a first objective part for imaging the pattern into a first intermediate image, a second objective part for imaging the first intermediate image into a second intermediate image, wherein the concave mirror is arranged in the region of a second pupil surface lying between the first and the second intermediate image, and a third objective part for imaging the second intermediate image into the image surface, the first deflection mirror is arranged in optical proximity to the first intermediate image and the second deflection mirror is arranged in optical proximity to the second intermediate image. Such catadioptric projection objectives of the R—C—R type have been known for many years. A projection objective of the R—C—R type has two real intermediate images between the object plane and image plane. A first, refractive objective part (abbreviation "R") generates a first real intermediate image of an object. A second, catadioptric or catoptric objective part (abbreviation "C") with a concave mirror generates a real second intermediate image from the first intermediate image. A third, refractive objective part then images the second intermediate image into the image plane. The deflection of the beam path between these three objective parts is formed by a deflection device having two planar deflection mirrors, which are oriented at right angles with respect to one another and which are in each case arranged in optical proximity to one of the intermediate images (see e.g. WO 2004/019128 A1 copy corresponding to U.S. Pat. No. 7,362,508 B2 or EP 1 751 601 B1).

Projection exposure methods for the exposure of a radiation-sensitive substrate arranged in the region of an image surface of a projection objective with at least one image of a pattern of a mask arranged in the region of an object surface of the projection objective are disclosed, wherein a projection objective having one or more of the features described above is used.

In some embodiments, the first deflection mirror and the second deflection mirror are displaced with the aid of the displacement device synchronously parallel to the first direction between a first position and a second position, which is offset by a displacement distance relative to the first position, for example between a first exposure and a second exposure, which follows the first exposure, during operation.

In certain embodiments, the field uniformity of the projection radiation within the effective image field is altered by displacement of the first and of the second deflection mirror parallel to the first direction, using the local radiation energy distribution being altered over the effective image field. In some embodiments, this can be achieved substantially without influencing the wavefront of the projection radiation. In certain embodiments, the wavefront of the projection radiation running through the projection objective to the image field is altered by displacement of the first and of the second deflection mirror parallel to the first direction, preferably without any significant influence on the radiation energy distribution in the effective image field.

Furthermore, the disclosure relates to a projection exposure apparatus for the exposure of a radiation-sensitive substrate arranged in the region of an image surface of a projection objective with at least one image of a pattern of a mask arranged in the region of an object surface of the projection objective, comprising: a primary radiation source for emitting primary radiation; an illumination system for receiving the primary radiation and for generating an illumination radiation directed onto the mask; and a projection objective for generating at least one image of the pattern in the region of the image surface of the projection objective, wherein the projection objective has one or more of the features described above.

The projection exposure apparatus may have a central control unit for controlling functions of the projection exposure apparatus, wherein the control unit is assigned a control module for driving the displacement drive and the displacement drive can be driven using the control module, for example using electrical signals, in coordination with other control signals during the operation of the projection exposure apparatus.

These and further features emerge not only from the claims but also from the description and the drawings, wherein the individual features can be realized in each case by themselves or as a plurality in the form of subcombinations and can constitute advantageous embodiments. Exemplary embodiments are illustrated in the drawings and are explained in greater detail below.

DETAILED DESCRIPTION

Figure 1:
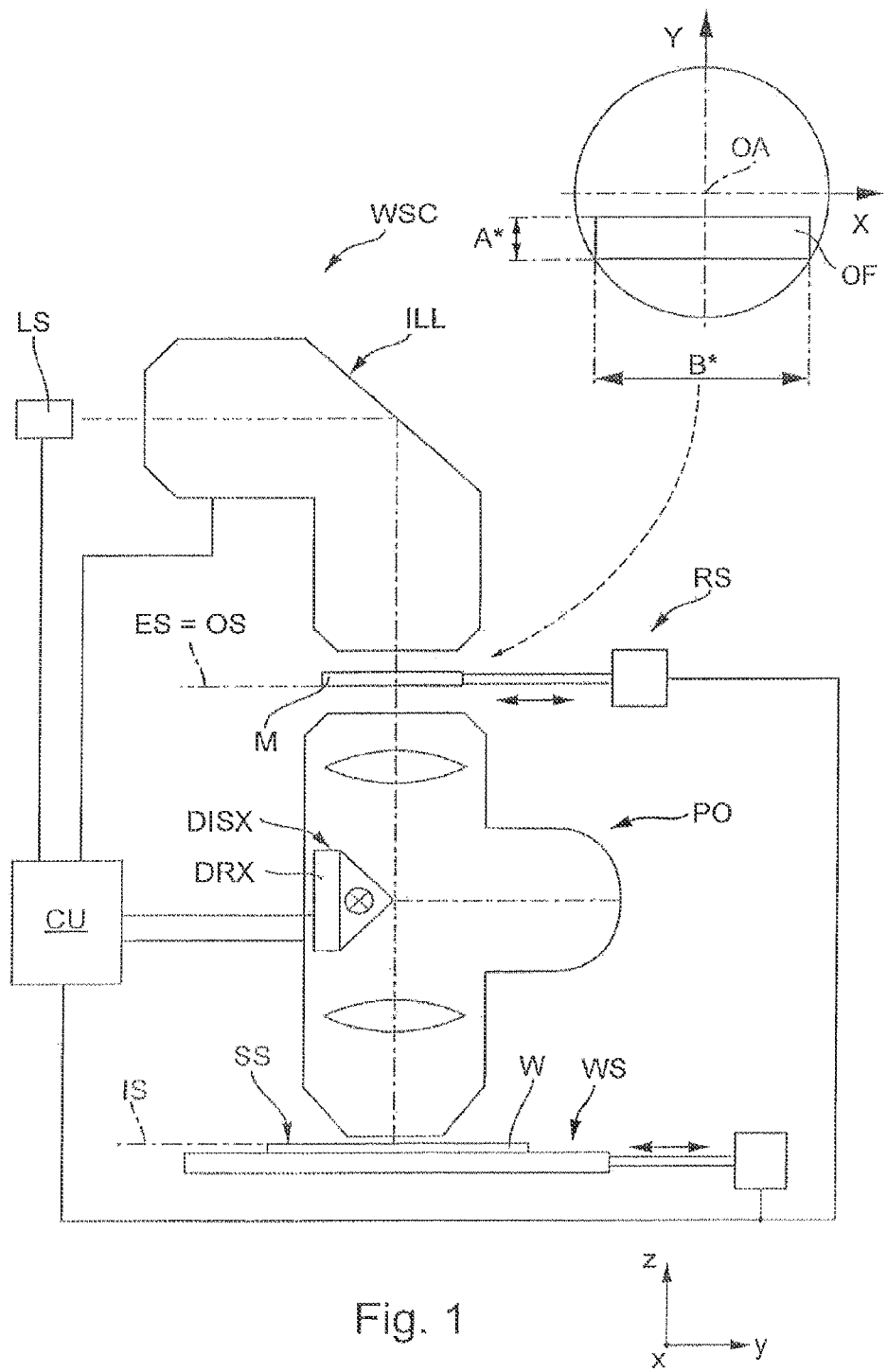
FIG. 1 shows a schematic illustration of a microlithography projection exposure apparatus.

FIG. 1 shows an example of a microlithography projection exposure apparatus WSC which can be used in the production of semiconductor components and other finely patterned components and operates with light or electromagnetic radiation from the deep ultraviolet range (DUV) in order to obtain resolutions down to fractions of micrometers. An ArF excimer laser having an operating wavelength $\lambda$ of approximately 193 nm serves as a primary radiation source or light source LS. Other UV laser light sources, for example $F_2$ lasers having an operating wavelength of 157 nm, or ArF excimer lasers having an operating wavelength of 248 nm, are likewise possible.

An illumination system ILL disposed downstream of the light source LS generates in its exit surface ES a large, sharply delimited and substantially homogeneously illuminated illumination field that is adapted to the telecentricity requirements of the projection objective PO arranged downstream in the light path. The illumination system ILL has devices for setting different illumination modes (illumination settings) and can be changed over for example between conventional on-axis illumination with varying degree of coherence a and off-axis illumination, wherein the off-axis illumination modes comprise for example an annular illumination or a dipole illumination or a quadrupole illumination or some other multipolar illumination. The construction of suitable illumination systems is known per se and is therefore not explained in greater detail here. The patent application US 2007/0165202 A1 (corresponding to WO 2005/026843 A2), discloses examples of illumination systems which can be used in the context of various embodiments.

Those optical components which receive the light from the laser LS and shape illumination radiation from the light, the illumination radiation being directed onto the reticle M, belong to the illumination system ILL of the projection exposure apparatus.

A device RS for holding and manipulating the mask M (reticle) is arranged downstream of the illumination system such that the pattern arranged at the reticle lies in the object plane OS of the projection objective PO, which coincides with the exit plane ES of the illumination system and is also referred to here as reticle plane OS. The mask is movable in this plane for scanner operation in a scanning direction (y-direction) perpendicular to the optical axis OA (z-direction), with the aid of a scanning drive.

Downstream of the reticle plane OS there follows the projection objective PO, which acts as a reducing objective and by which an image of the pattern arranged at the mask M is imaged at a reduced scale, for example at the scale 1:4 ($|\beta|=0.25$) or 1:5 ($|\beta|=0.20$) onto a substrate W covered with a photoresist layer, the light-sensitive substrate surface SS of the substrate lying in the region of the image plane IS of the projection objective PO.

The substrate to be exposed, which is a semiconductor wafer W in the case of the example, is held by a device WS comprising a scanner drive for moving the wafer synchronously with the reticle M perpendicular to the optical axis OA in a scanning direction (y-direction). The device WS, also referred to as "wafer stage", and the device RS, also referred to as "reticle stage", are part of a scanner device which is controlled using a scanning control device which, in the embodiment, is integrated into the central control unit CU of the projection exposure apparatus.

The illumination field generated by the illumination system ILL defines the effective object field OF used during the projection exposure. The latter is rectangular in the case of the example and has a height A* measured parallel to the scanning direction (y-direction) and a width B*>A* measured perpendicular thereto (in the x-direction). The aspect ratio AR=B*/A* is generally between 2 and 10, in particular between 3 and 6. The effective object field lies at a distance in the y-direction alongside the optical axis (off-axis field). The effective image field—which is optically conjugate with respect to the effective object field—in the image surface IS has the same form and the same aspect ratio between height B and width A as the effective object field, but the absolute field size is reduced by the imaging scale β of the projection objective, i.e. $A=|\beta|A^*$ and $B=|\beta|B^*$.

Figure 2:
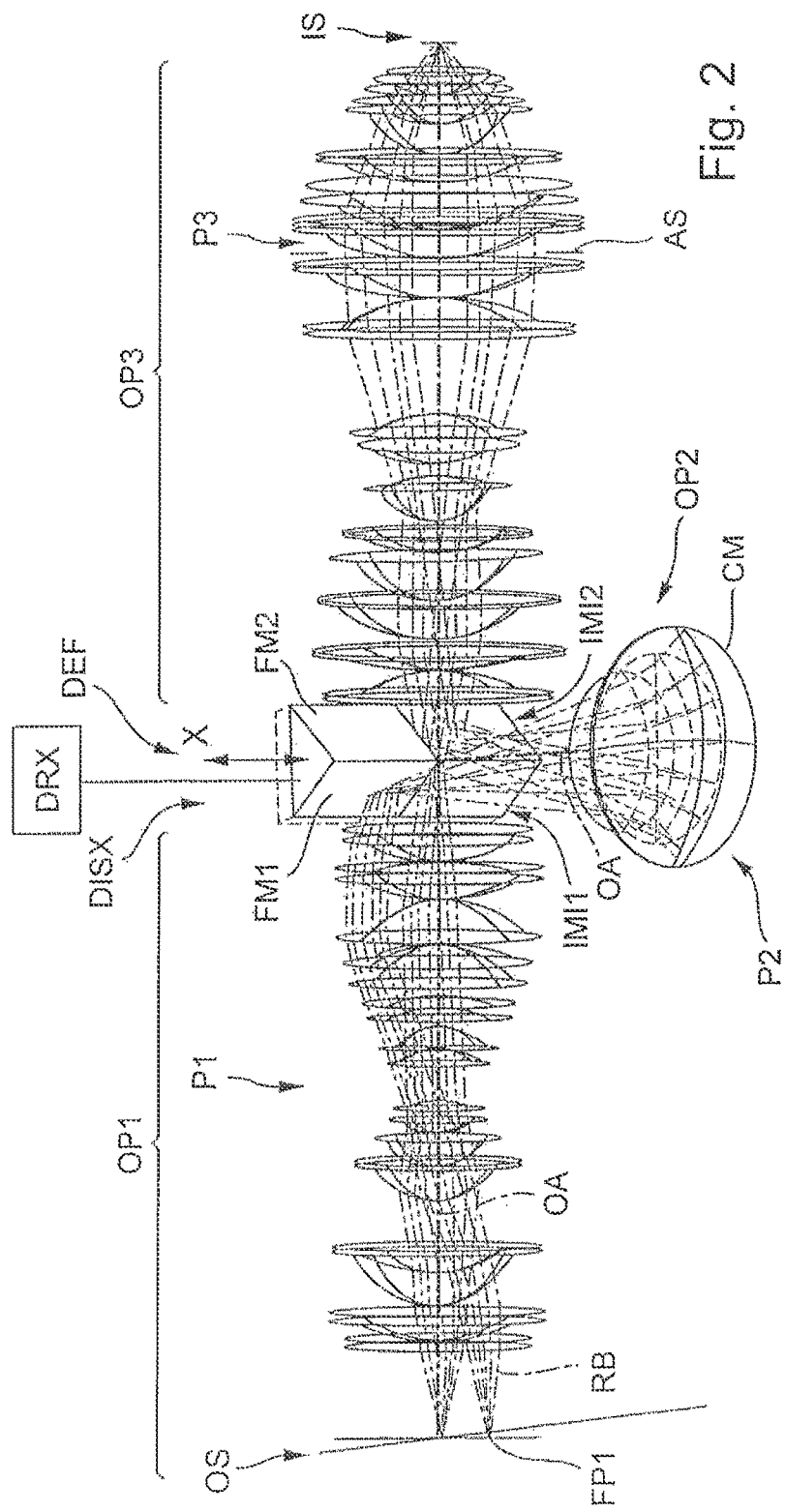
FIG. 2 shows a schematic, quasi-three-dimensional illustration of an embodiment of a catadioptric projection objective with a displaceable beam deflection device.

FIG. 2 shows a schematic, quasi-three-dimensional illustration of an embodiment of a catadioptric projection objective 200 with selected radiation beams for illustrating the beam path of the projection radiation running through the projection objective during operation. The projection objective is provided for imaging a pattern of a mask arranged in its object plane OS, on a reduced scale, for example on a scale of 4:1, onto its image plane IS oriented parallel to the object plane. In this case, exactly two real intermediate images IMI1, IMI2 are generated between the object plane and image plane. A first, purely refractive (dioptric) objective part OP1 is designed in such a way that the pattern of the object plane is imaged into the first intermediate image IMI1 substantially without any change in size. A second, catadioptric objective part OP2 images the first intermediate image IMI1 onto the second intermediate image IMI2 substantially without any change in size. A third, purely refractive objective part OP3 is designed for imaging the second intermediate image IMI2 into the image plane IS with high demagnification.

Pupil surfaces P1, P2, P3 of the imaging system lie between the object plane and the first intermediate image, between the first and the second intermediate image, and also between the second intermediate image and the image plane, in each case where the principal ray of the optical imaging intersects the optical axis OA. The aperture stop AS of the system is fitted in the region of the pupil surface P3 of the third objective part OP3. The pupil surface P2 within the catadioptric second objective part OP2 lies in direct proximity to a concave mirror CM.

If the projection objective is designed and operated as an immersion objective, then during the operation of the projection objective radiation passes through a thin layer of an immersion liquid situated between the exit surface of the projection objective and the image plane IS. Immersion objectives having a comparable basic construction are disclosed e.g. in the international patent application WO 2004/019128 A2.

Image-side numerical apertures NA>1 are possible during immersion operation. A configuration as a dry objective is also possible; in this case, the image-side numerical aperture is restricted to values NA<1.

The catadioptric second objective part OP2 contains the sole concave mirror CM of the projection objective. A deflection device DEF serves for separating the radiation beam running from the object plane OS to the concave mirror CM from that radiation beam which, after reflection at the concave mirror, runs between the latter and the image plane IS. For this purpose, the deflection device has a planar first deflection mirror FM1 for reflecting the radiation coming from the object plane to the concave mirror CM and a second deflection mirror FM2, which is oriented at right angles with respect to the first deflection mirror FM1 and which deflects the radiation reflected by the concave mirror in the direction of the image plane IS. Since the optical axis is folded at the deflection mirrors, the deflection mirrors are also referred to as folding mirrors in this application. The deflection mirrors are tilted, e.g. by 45°, relative to the optical axis OA of the projection objective about tilting axes running perpendicular to the optical axis and parallel to a first direction (x-direction). In the case where the projection objective is designed for scanning operation, the first direction (x-direction) is perpendicular to the scanning direction and thus perpendicular to the direction of movement of the mask (reticle) and the substrate (wafer). The x-axis shown in FIG. 2 does not lie in the plane of the drawing, but rather obliquely with respect thereto, in this illustration.

One special feature is that the planar deflection mirrors FM1, FM1 are mechanically fixedly connected to one another, which is achieved in the case of the example by virtue of the fact that they have a common carrier structure. For this purpose, the deflection device DEF is realized by a prism whose externally mirror-coated cathetus surfaces oriented perpendicularly to one another serve as deflection mirrors.

A further special feature is that the prism is mounted such that it is moveable using a linear guide in such a way that it can be displaced linearly as a whole parallel to the x-direction, that is to say parallel to the first direction or parallel to the prism edge formed by the deflection mirrors situated at an angle with respect to one another. The linear guide is part of a displacement device DISX for the synchronous displacement of the first and second deflection mirrors parallel to the first direction between a first position and a second position, which is offset by a displacement distance relative to the first position. The displacement device furthermore has a displacement drive DRX for the synchronous displacement of the first and second deflection mirrors parallel to the first direction. An electric, in particular a piezoelectric, drive can be involved, for example, which can be driven via a corresponding control module in the central control unit CU of the projection exposure apparatus using electrical signals in coordination with other control signals during the operation of the projection objective. The displacement distances that can be obtained can be e.g. of the order of magnitude of one or several millimeters. Particularly in the case of manipulators having non-planar mirror surfaces, the displacement distances can also be smaller and e.g. of the order of magnitude of a hundred or a few hundred μm.

The intermediate images IMI1, IMI2 in each case lie in optical proximity to the folding mirrors FM1 and FM2, respectively, closest to them, but are at a minimum optical distance from the folding mirrors, such that possible defects on the mirror surfaces are not imaged sharply into the image plane and the planar deflection mirrors (plane mirrors), FM1, FM2 lie in the region of moderate radiation energy density.

The positions of the (paraxial) intermediate images define field planes of the system which are optically conjugate with respect to the object surface and with respect to the image surface. The deflection mirrors therefore lie in optical proximity to field planes of the system, which is also referred to as "near the field" in the context of this application. In this case, the first deflection mirror is arranged in optical proximity to a first field plane, which is associated with the first intermediate image IMI1, and the second deflection mirror is arranged in optical proximity to a second field plane, which is optically conjugate with respect to the first field plane and is associated with the second intermediate image IMI2.

In this application, the optical proximity or the optical distance of an optical surface with respect to a reference plane (e.g. a field plane or a pupil plane) is described by the so-called subaperture ratio S. The subaperture ratio S of an optical surface is defined for the purposes of this application as follows:

$$S = \text{sign } h(r/(|h|+|r|))$$

where r denotes the marginal ray height, h denotes the principal ray height and the signum function sign x denotes the sign of x, where according to convention sign 0=1 is applicable. Principal ray height is understood to mean the ray height of the principal ray of a field point of the object field with maximum field height in terms of absolute value. The ray height should be understood here to be signed. Marginal ray height is understood to mean the ray height of a ray with maximum aperture proceeding from the point of intersection of the optical axis with the object plane. This field point does not have to contribute to the transfer of the pattern arranged in the object plane—particularly in the case of off-axis image fields.

The subaperture ratio is a signed value that is a measure of the field or pupil proximity of a plane in the beam path. The subaperture ratio is normalized by definition to values of between −1 and +1, the subaperture ratio being zero in each field plane and the subaperture ratio jumping from −1 to +1, or vice versa, in a pupil plane. A subaperture ratio of 1 in terms of absolute value thus determines a pupil plane.

Planes near the field therefore have subaperture ratios that are close to 0, while planes near the pupil have subaperture ratios that are close to 1 in terms of absolute value. The sign of the subaperture ratio indicates the position of the plane upstream or downstream of a reference plane.

For the two deflection mirrors it holds true here that no optical element is arranged between the deflection mirror and the closest intermediate image (direct proximity) and that the subaperture ratio S is less than 0.3, in particular less than 0.2, in terms of absolute value. In the case of the example, S=−0.03 holds true for the first deflection mirror and S=0.13 holds true for the second deflection mirror.

The imaging scale of the second objective part, which images the first intermediate image into the second intermediate image, is close to or is −1 in the first direction (x-direction, imaging scale $\beta_x$), and is close to or is +1 in the y-direction perpendicular thereto. The first intermediate image is therefore imaged into the second intermediate image substantially without any change in size, the first direction being mirrored, whereas the y-direction is not. In the case of the example, $\beta_x = -1.01$ holds true.

The negative sign of the imaging scale $\beta_x$ in the first direction means that, in the case of passing through the pupil at the concave mirror CM, the positions "top" and "bottom" or "front" and "back" with respect to the first direction (x-direction) are interchanged. This is shown clearly in FIG. 2 on the basis of the beam path of a radiation beam RB that emerges from a field point FP1 lying outside the optical axis at the edge of the effective object field. The rays emerging from the field edge impinge on the first deflection mirror FM2 above and the second deflection mirror FM2 after reflection at the concave mirror CM below the y-z plane (meridional plane) spanned by those parts of the folded optical axis OA which are oriented at an angle with respect to one another. The schematic illustration in FIG. 2 also shows that, on account of the small distance between the intermediate images IMI1 and IMI2 and the respective closest falling mirror FM1 and FM2, the rays emerging from the field point FP1 do not converge at one point on the folding mirrors, but rather impinge on the mirror surfaces in a small, areally extended region. The size of the region corresponds to the subaperture of the radiation beam that is associated with the field point FP1 at the respective mirror surface, wherein the optical aberrations, such as e.g. coma, also contribute to the actual form and extent of the region occupied by the radiation beam on the mirror surface. A radiation beam emerging from an opposite field point at the other field edge is not shown, for reasons of clarity, but the conditions correspond.

The particular optical conditions in the region of the deflection mirrors FM1, FM2 are used in the exemplary embodiment to provide an active manipulator with the aid of which certain field-dependent optical properties of the projection objective can be influenced in a targeted manner as required during the operation of the projection objective. This does not necessitate any additional optical elements in the projection objective. Rather, the manipulation possibility is obtained using the synchronous, linear displaceability of the deflection mirrors in conjunction with special features in the reflection coatings of the mirrors. This is explained in greater detail below with reference to FIG. 3.

FIG. 3 shows, in 3A and 3B, two plan views of the folding mirrors (deflection mirrors) FM1, FM2 situated at an angle with respect to one another, from the direction of that part of the optical axis which is defined by the axis of symmetry of the concave mirror CM, that is to say from the z-direction. The prism edge PE which is defined by the deflection mirrors situated at an angle with respect to one another and runs in the x-direction (first direction) can readily be discerned. The so-called "footprints" FTP1 and FTP2 of a projection radiation beam are shown on the respective elongated-rectangular mirror surfaces of the deflection mirrors. The footprints correspond to that region of the deflection mirrors which is illuminated overall by the projection radiation beam and which is used for reflection. The footprints FTP1 and FTP2 are shown as virtually rectangular in the schematic illustration. This makes it clear that the cross section of the projection radiation beam at the location of the deflection mirrors, on account of the field proximity of the deflection mirrors (small subaperture ratio), virtually corresponds to the rectangular form of the effective object field. The rounded corners of the footprints clearly reveal that this form deviates from the exact rectangular form on account of the minimum optical distance of the mirror surfaces from the closest intermediate images (and on account of aberrations). For clarification purposes it should also be mentioned that the cross section of the projection radiation beam at an optical surface lying in proximity to a pupil surface is substantially circular in the case of the projection objectives illustrated.

The illuminated regions (footprints) have virtually identical dimensions. This results from the circumstance that the second objective part OP2, which images the first intermediate image onto the second intermediate image, has an imaging scale that is close to 1 in terms of absolute value. It should also be mentioned that the absolute size of the first footprint FTP1 is substantially determined by the size of the effective object field and the imaging scale of the first objective part OP1. If the latter, as in the case of the present example, is close to 1 in terms of absolute value, the absolute dimensions of the two footprints FTP1, FTP2 correspond approximately to the absolute dimensions of the effective objective field OF.

The locations designated by FP1' and FP1" are identified in the regions of the footprints, in which locations a radiation beam coming from a fixedly chosen, off-axis field point FP1 impinges on the respective deflection mirrors, that is to say the subapertures associated with this field point. It can be discerned that, on account of the negative imaging scale of the second objective part, the positions of these impingement regions with respect to the x-direction are interchanged in the sense that the subaperture FP1' associated with the field point FP1 lies on the first deflection mirror as viewed in the +x-direction in proximity to the back narrow field edge, while the corresponding subaperture FP1" lies on the second deflection mirror FM2 in proximity to the front field edge.

Figure 3A:
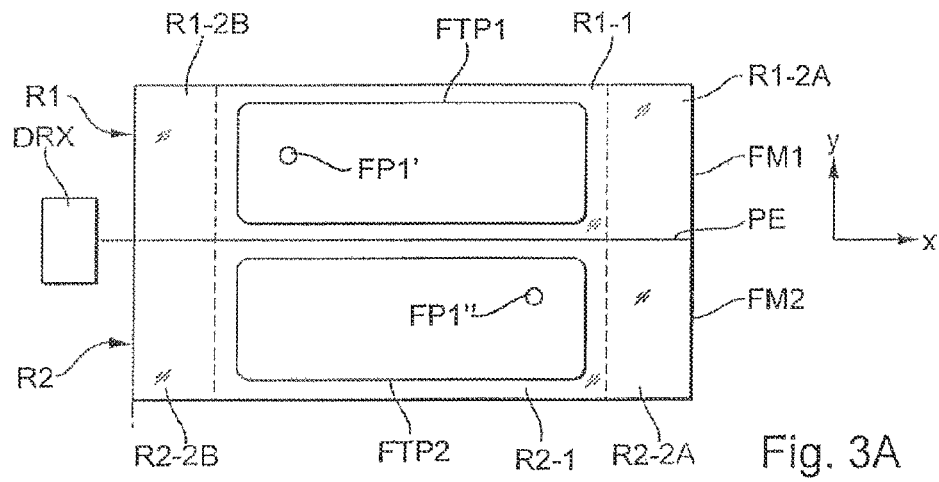
FIG. 3 shows, in 3A and 3B, plan views of the deflection mirrors, which are at an angle with respect to one another, from the direction of that part of the optical axis which is defined by the axis of symmetry of the concave mirror.
Figure 3B:
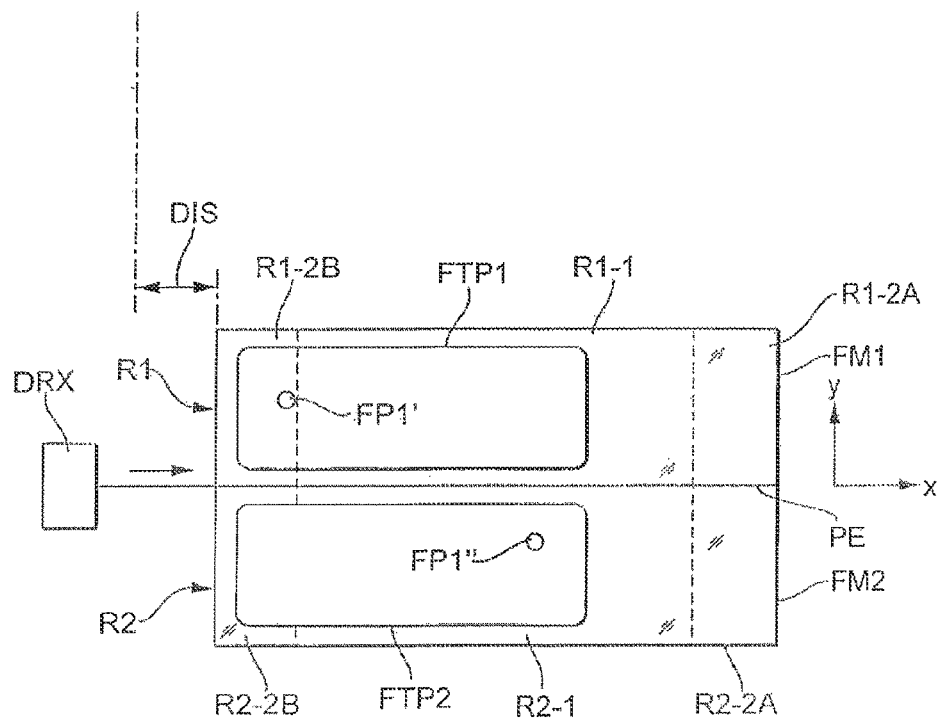

FIG. 3A shows the deflection mirrors in a first position (neutral position), which is assumed for example after the production of the projection objective and the adjustment of the deflection prism performed in the process. FIG. 3B shows the deflection mirrors in a second position, which is offset laterally relative to the first position and which can be assumed by synchronous displacement of the deflection mirrors by a displacement distance DIS parallel to the x-direction (first direction) with the aid of the displacement drive DRX. It can be discerned from the figures that the absolute positions of the footprints do not change during this displacement since merely the deflection mirrors are displaced relative to the remaining optical elements of the projection objective which determine the course of the projection radiation beam.

One special feature of the deflection mirrors is that the latter respectively have first and second reflection coatings, the reflection properties of which (represented e.g. by the reflectance R or the surface form) is not constant over the entire mirror surface, but rather varies locally. In the example, the first deflection mirror FM1 has a first reflection coating R1 and the second deflection mirror FM2 has a second reflection coating R2. The reflection coatings R1 and R2 are respectively subdivided into first layer regions having a first local distribution of the corresponding reflection property and second layer regions having a second local distribution of the reflection property, which differs from the first local distribution of the reflection property. The second layer regions lie in each case, as viewed in the first direction (x-direction) alongside the first layer regions. Thus, the first reflection layer R1 has a first layer region R1-1, the extent of which in the x-direction is somewhat larger than that of the first footprint FTP1, such that the latter lies completely within the first layer region in the neutral position (FIG. 3A). A second layer region R1-2A lies in front of the first layer region in the x-direction, and a further second layer R1-2B lies behind it in the x-direction. For clarification purposes, the layer regions are separated from one another by dashed lines. A corresponding division with first layer region R2-1 and second layer regions R2-2A and R2-2B is present in the case of the second reflection coating R2. The local distributions of the reflection properties of the two reflection coatings R1, R2 can be identical, but they can also be different from one another.

The manipulator effect of the displaceable mirror prism will now be explained on the basis of the comparison of FIGS. 3A and 3B. In the first position (neutral position) of the deflection mirrors (FIG. 3A), the projection radiation beam is reflected in first reflection regions in each case on both deflection mirrors. The first reflection region at the first deflection mirror corresponds to that region of the first deflection mirror which is illuminated by the projection radiation beam before the displacement, that is to say that region which is covered by the first footprint FTP1 in the neutral position of the mirrors. The first reflection region at the second deflection mirror corresponds to the associated region of the second deflection mirror which is illuminated by the projection radiation beam, that is to say that region which is covered by the second footprint FTP2 in the neutral position of the mirrors. The position and size of the first reflection regions are therefore identical to the position and size of the footprints FTP1 and FTP2 in FIG. 3A. The reflection properties of each reflection region are in each case determined by the associated local distribution of the reflection property in the first layer regions R1-1 and R1-2, respectively. The reflection property (e.g. the reflectance) can be locally constant, for example, within the layer regions, but it can also vary locally within the first layer regions.

If the deflection mirrors are displaced by a displacement distance DIS synchronously parallel to the x-direction into a second position (FIG. 3B), then second reflection regions that are offset by the displacement distance DIS laterally relative to the first reflection regions at the same deflection mirror are respectively illuminated at the deflection mirrors. The second reflection region at the first deflection mirror corresponds to that region of the first deflection mirror which is illuminated by the projection radiation beam after the displacement, that is to say that region which is covered by the first footprint FTP1 after the displacement. The second reflection region at the second deflection mirror corresponds to that region of the second deflection mirror which is illuminated by the projection radiation beam after the displacement, that is to say that region which is covered by the second footprint FTP2 after the displacement. The position and size of the second reflection regions are therefore identical to the position and size of the footprints FTP1 and FTP2 in FIG. 3B.

Within the second reflection regions, the projection radiation no longer impinges exclusively in first layer regions, but rather now in part also impinges in the second layer regions R1-2B and R2-2B. Since the reflection properties of the reflection coating R1, R2 in these second layer regions differ from those of the first layer regions, alterations in the energy distribution over the cross section of the projection radiation occur e.g. in the case of different reflectances for the affected field edges, the alterations being brought about by the manipulator effect.

It is particularly noticeable here that, by way of example, for the considered radiation beam which emerges from the first field point FP1 and which impinges on the mirror surfaces in the regions FP1' and FP1", a different alteration of the reflection properties occurs at the first deflection mirror FM1 compared with that at the second deflection mirror FM2. This is because while the associated rays are then reflected in a second layer region R1-2B at the first deflection mirror, they are still reflected in the first layer region R2-1 of the second layer at the second deflection mirror FM2. Consequently, with regard to the reflection properties that have an effect overall, a differentiating effect occurs in so far as only the difference between the change at the first folding mirror and the change at the second folding mirror is effective for the total change in the beam influencing.

If, by way of example, the reflectance of the second deflection mirror FM2 is locally constant in its first layer region R2-1, then no change in the effective reflectance arises as a result of the displacement of the mirror prism at the second deflection mirror FM2 for the radiation beam considered. At the first deflection mirror FM1, by contrast, a change occurs which results from the difference between the reflectance at the original location of the reflection in the first layer region and the reflectivity at the new position after the displacement in the second layer region R1-2B.

The function of this active manipulator for influencing field effects is explained below on the basis of some examples. In examples for predominantly energetic manipulation (FIGS. 4 and 5), the manipulator is primarily used for the variable setting of the field uniformity. For this purpose, the local distribution of the reflectance of the first and second reflection coatings is set in a targeted manner such that alterations of the total reflectivity brought about by the deflection mirrors are obtained differently as a result of synchronous displacement of the deflection mirrors in the x-direction for individual field points, thus resulting in a corresponding field-dependent influence on the total transmission of the projection objective. Another example (FIG. 6) shows a manipulator for the field-dependent influencing of the optical path lengths, that is to say of the wavefront. In so far as the following figures show elements identical or corresponding to those in the previous figures, identical or corresponding reference designations are used.

Figure 4A:
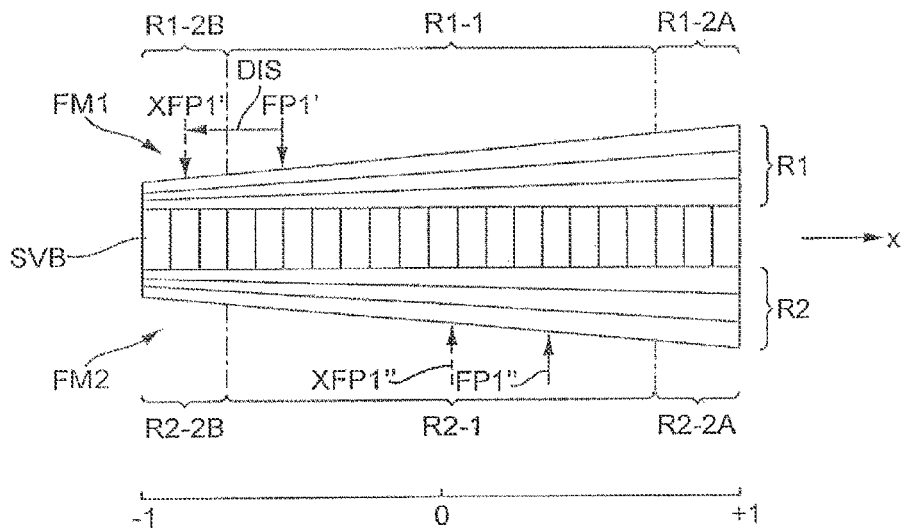
FIG. 4 schematically shows in 4A the construction and the function of an exemplary embodiment of a reflective manipulator wherein the two deflection mirrors have multilayered reflection layers with a linear change in the layer thicknesses in the first direction over the entire optically usable region of the respective mirror surfaces, in 4B a nominal layer thickness as a function of location on the mirrors, in 4C a reflection in a first direction as a function of location on the mirrors, in 4D a total transmission T[%] along a line in the centre of the image field parallel to a first direction as a function of location, and in 4E a relative transmission $T_{REL}$ normalized to the transmission values of the neutral position (displacement DIS=0 mm) as a function of location.

In the case of the exemplary embodiment explained with reference to FIG. 4, the two deflection mirrors are formed in each case dielectrically reinforced metal mirrors. Here a reflection coating R1 and R2, respectively, has a metal layer composed of aluminium applied on a planar surface of the common mirror substrate SUB, on which metal layer is applied, for the purpose of optimizing reflection, in each case a dielectric layer system consisting of many individual layers. Each of the multilayered reflection layers is characterized by a linear change in the layer thicknesses of the dielectric individual layers and hence also in the total layer thickness in the first direction (x-direction) over the entire optically usable region of the respective mirror surfaces. This is also referred to as "linear layer thickness tilt" in the x-direction. In the direction perpendicular thereto, which runs parallel to the substrate surface, the layer thicknesses are constant in each case. For clarification purposes, FIG. 4A schematically shows a section through the prism-type carrier element or substrate SUB with the reflection coatings R1 and R2 fitted on the cathetus surfaces.

A reflection layer system used for exemplary calculations corresponds, with regard to the basic construction of the layer structure (layer sequence), to comparative Example 1—taken from the prior art in U.S. Pat. No. 6,310,905—from the patent specification U.S. Pat. No. 7,583,443 B2, the content of which in this respect is incorporated by reference in the content of this description. The layer system, designed for the operating wavelength $\lambda=193$ nm, has alternately high and low refractive index dielectric individual layers in accordance with the notation $L_i/[H/L_2]^x$, where $L_i$ and $L_2$ represent the low refractive index layers, H represents high refractive index layers and x represents an integer between 1 and 10. The letters $L_i$, $L_2$ also stand for the optical layer thicknesses of the individual layers, such that optical layer thickness differences can be indicated in the form of an inequality, e.g. in accordance with $L_i<L_2$. The letter x denotes the repetition index, that is to say the number of successive repetitions of a layer thickness pair $HL_2$ on the first low refractive index layer $L_i$, closest to the substrate. The optical layer thicknesses $H_i$, $L_i$ result from the geometric layer thicknesses $d_L$ and $d_H$, respectively, and the angle $\alpha$ of incidence of a considered ray in a layer i in accordance with $L_i=(n_{Li,Hi} \, d_{Li,Hi} \cos \alpha)/\lambda$. In the case of the layer system used, the complex refractive indices of the layer materials are given by $n_H=1.778-i0.0026$ and $n_L=1.359-i0.0004$, where the imaginary part in each case describes the absorption in the respective layer material. The layer construction of the dielectric multilayer system of the reflection layers R1 and R2 is given in each case by $0.128/[0.253/0.257]^7$.

Figure 4B:
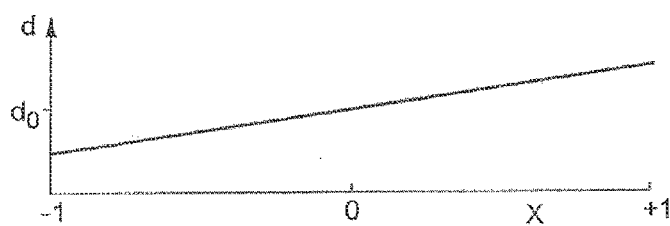
Figure 4C:
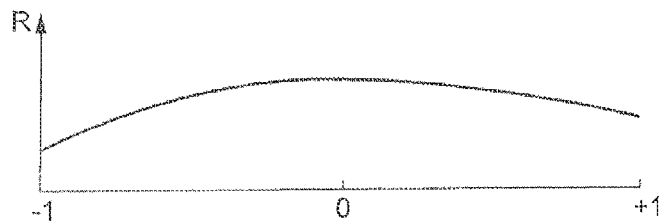

The nominal layer thicknesses resulting from this basic construction are present in the centre of the mirrors (at x=0), towards the mirror edges the layer thicknesses become smaller in the −x-direction and larger in the +x-direction (cf. FIG. 4B). Relative to a thickness factor 1 for x=0, the gradient in this example is $4.09 \times 10^{-4}$/mm for the first reflection layer and $3.75 \times 10^{-4}$/mm for the second reflection layer. The linear local change in the (geometric) layer thicknesses in the first direction brings about a (normally non-linear) variation of the reflectance R in the first direction. This is elucidated by way of example in FIG. 4C. The nominal layer thicknesses present in the region of the mirror centre (x=0) can be optimized in such a way that, on average, a particularly high reflectance R results in this region for the spectrum of the angles of incidence (angle-of-incidence distribution) present in the projection radiation beam. The alteration of the layer thicknesses relative to this "optimized" layer thickness then brings about, towards the field edges, a "detuning" of the reflection effect of the reflection layer system for the impinging radiation, such that the average reflectance towards the edges of the mirror (in the first direction) normally falls slightly relative to the average. Other profiles are also possible.

As already generally described in connection with FIG. 3, the local profile of the radiation intensity in the effective image field can be altered in a targeted manner using a displacement of the two deflection mirrors in the first direction in order, for example, to manipulate and, if appropriate, to optimize the field uniformity. This will be explained in greater detail in connection with FIG. 4A, in which identical or corresponding elements have reference designations identical or corresponding to those in FIG. 3.

If the prism with the two deflection mirrors is situated in the first position (neutral position), then a ray coming from the first field point FP1 impinges on the first deflection mirror FM1 at the location FP1' and, in the further course of the steel path, on the second deflection mirror FM2 at the position designated by FP1". These positions are identified by vertically extending solid arrows in FIG. 4A. The reflection losses caused by the reflections at the two deflection mirrors bring about a specific reduction of the radiation intensity, which is manifested for the associated field point in the effective image field in a specific value for the total transmission T, which can be defined, for example, by the ratio of the intensity $I_{OB}$ at the object point to the intensity $I_{IM}$ at the optically conjugate image point in accordance with $T=I_{OB}/I_{IM}$. The reflectances at the locations FP1' and FP1" are critical for the reflection losses.

If the deflection mirrors are then displaced by a displacement distance DIS, identified by a horizontal solid arrow, synchronously parallel to the first direction, the same ray then impinges on the first deflection mirror FM1 at the position XFP1', identified by a dashed arrow, with a smaller layer thickness in comparison with the position FP1'. At the second deflection mirror FM2, the same ray impinges on the position XFP1", identified by a dashed arrow, which is displaced by the displacement distance DIS in the first direction relative to FP1". Here, too, the ray "sees" a different reflection coating with a somewhat smaller layer thickness. The change in the reflectivity during the transition between the impingement points FP1' and XFP1' on the first deflection mirror and also FP1" and XFP1" on the second deflection mirror are different, however, such that the reflection losses caused by the two reflections also changes by comparison with the first position of the deflection mirrors. This alteration of the reflection losses leads to an alteration of the total transmission associated with the corresponding image point in the effective image field. A fundamentally similar effect occurs for all rays which run to the effective image field in a manner proceeding from a field points lying within the effective object field, in which case, however, the extent of the change arises with different magnitudes for different rays, thus resulting overall in an alteration of the local transmission profile over the effective image field.

Figure 4D:
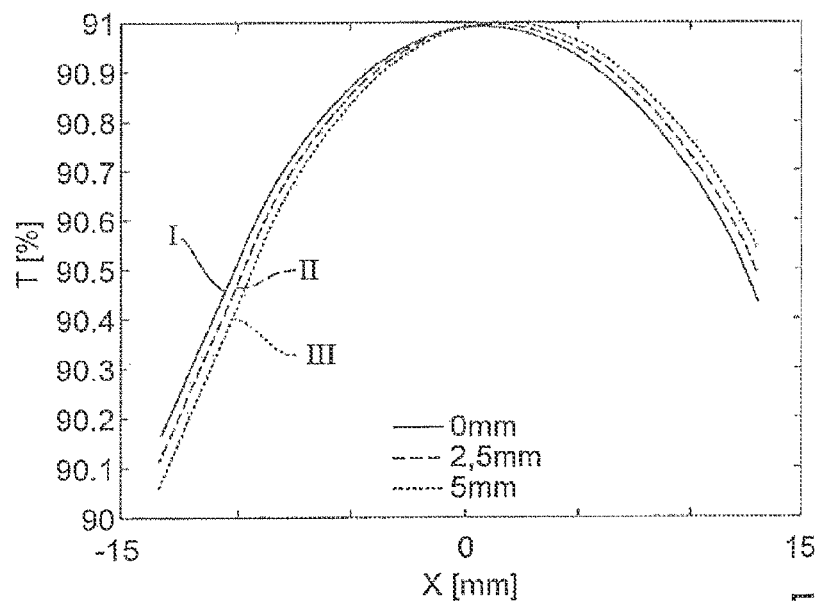
Figure 4E:
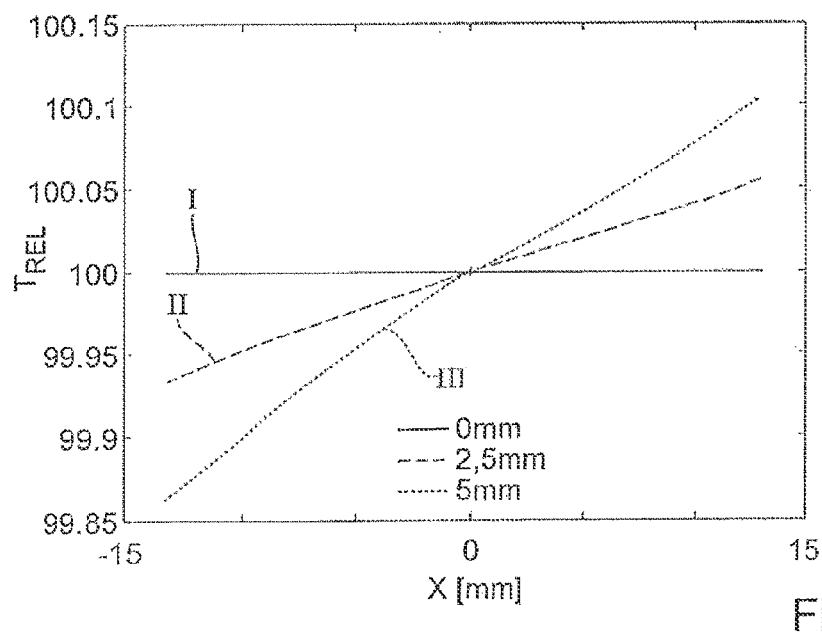
Figure 5A:
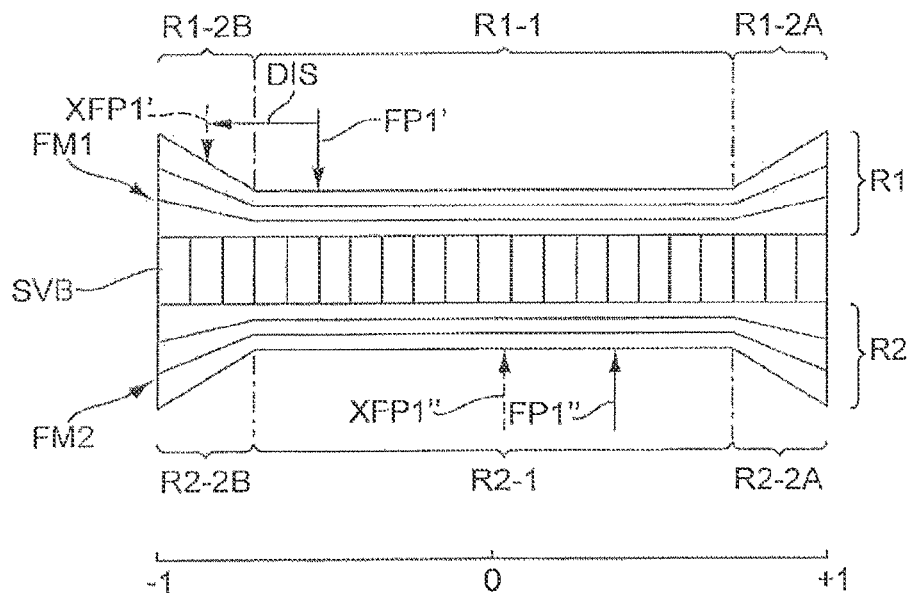
FIG. 5 schematically shows in 5A the construction and the function of an exemplary embodiment wherein the two deflection mirrors have reflection layers having a central region of constant layer thickness and edge regions with a linear change in the layer thicknesses, in 5B a nominal layer thickness as a function of location on the mirrors, in 5C a reflection in a first direction as a function of location on the mirrors, in 5D a total transmission T[%] along a line in the centre of the image field parallel to a first direction as a function of location, and in 5E a relative transmission TREL normalized to the transmission values of the neutral position (displacement DIS=0 mm) as a function of location.
Figure 5B:
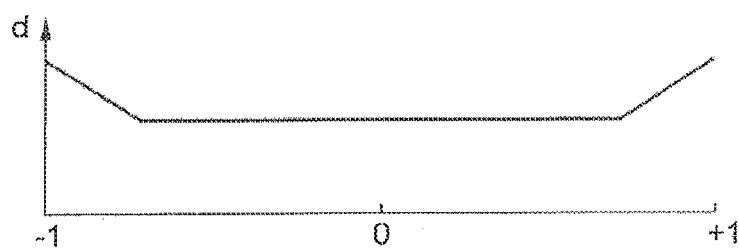
Figure 5C:
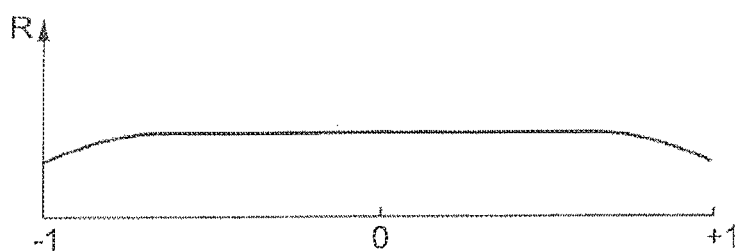
Figure 5D:
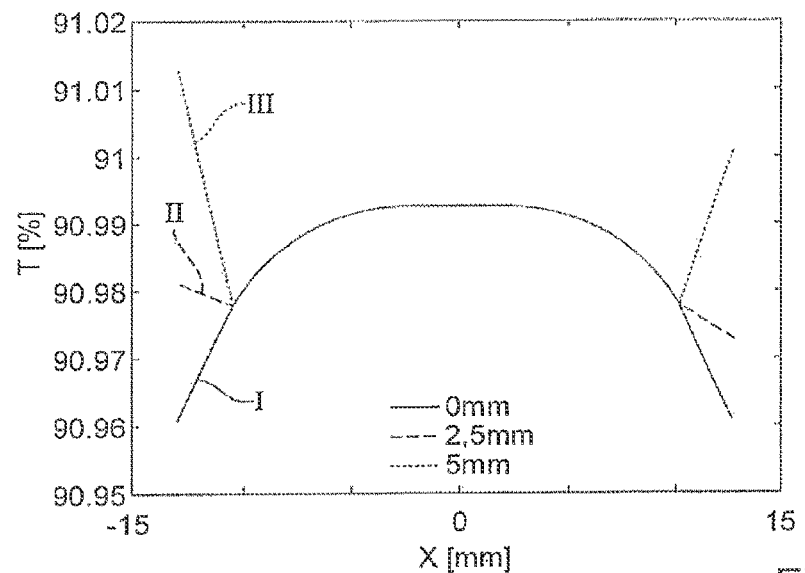
Figure 5E:
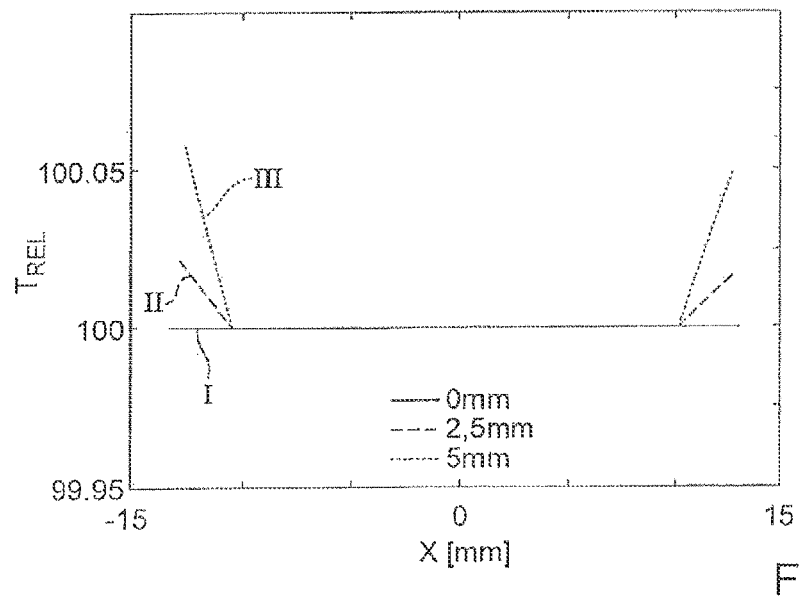

FIG. 4D illustrates by way of example the local profile of the total transmission T along a line in the centre of the image field parallel to the first direction (x-direction). The abscissa indicates the image field coordinates on both sides of the centre of the image field (x=0), and the ordinate indicates the transmission values T in percent. The solid line I corresponds to the transmission profile in the image field if the deflection mirrors are situated in the first position (neutral position). The dashed line II results after a displacement by a displacement distance of 2.5 mm, and the dotted line III results after a displacement by a displacement distance of 5 mm. A tilting of the transmission in the x-direction can thus be produced by the displacement of the deflection mirrors. This becomes particularly clear from the normalized illustration in FIG. 4E, where, instead of the absolute values T of the transmission, the relative transmission $T_{REL}$ normalized to the transmission values of the neutral position (displacement DIS=0 mm) is plotted on the ordinate.

The specification of the projection objective used for the calculation of the total transmission corresponds to that of the first exemplary embodiment (illustrated in FIG. 2) from WO 2004/019128 A2, which is incorporated by reference in the content of this description. An ideal antireflective coating (no reflection losses) was assumed for all lens surfaces, and an ideal mirror coating (no absorption losses) was assumed for the concave mirror.

Since the two deflection mirrors are not subjected to identical loading in the exemplary embodiment (the angle-of-incidence distributions at the deflection mirrors are different) a certain tilt in the transmission profile in the x-direction is already present without displacement, that is to say that, in this example, the transmission already varies in the neutral position of the deflection mirrors in the first direction. The effect could change as a result of the alteration of the gradients of the layer profiles. It can be discerned at any rate that the transmission profile in the first direction can change as a result of the displacement of the deflection mirrors. In the case of the example, the total transmission in the range of negative x-values is increased approximately proportionally to the extent of the displacement, while at the same time the transmission values for positive x-values increase approximately proportionally to the extent of the displacement. It can also be discerned that the changes in the total transmission which are produced by the manipulator movement arise in the entire field. Overall, there arises a change in the field uniformity FU, which is defined in this application by $FU=(T_{max}-T_{min})/(T_{max}+T_{min})$, where $T_{max}$ and $T_{min}$ are the maximum value and the minimum value, respectively, of the total transmission T in the effective image field.

A possibility wherein only the regions near the field edges in the x-direction are influenced with the aid of the reflective manipulator will now be presented with reference to FIG. 5. The multilayered reflection coatings R1 and R2 shown schematically in FIG. 5A in each case have, in their inner first layer region R1-1 and R2-1, respectively, constant layer thicknesses, that is to say no local variation of the layer thickness and, consequently, given approximately identical angular loading, also substantially no local variation of the reflectance R (cf. FIGS. 5B and 5C). As explained with reference to FIG. 3, these first reflection regions, in the neutral position of the deflection mirrors (first position), are used for the reflection of the projection ray. In the outer second layer regions near the mirror edges, oppositely directed linear layer thickness changes (layer thickness gradients) are present (FIG. 5B), which lead, in a manner similar to that in the exemplary embodiment of FIG. 4, to a gradual decrease in the average reflectance R towards the edges (FIG. 5C). The layer thickness gradient in the edge region is $3.75*10^{-3}$/mm for the first deflection mirror and $5*10^{-3}$/mm for the second deflection mirror in the case of the example.

The effect of this reflective manipulator difference from that from FIG. 4. In the neutral position (first position) of the deflection mirrors, a ray coming from the field point FP1 impinges on the positions FP1' at the first deflection mirror and FP1" at the second deflection mirror. Both reflection locations lie within the first layer region having a constant layer thickness. After synchronous displacement of the deflection mirrors by the displacement distance DIS, the impingement point XFP1' of the same ray at the first deflection mirror FM1 lies in the second layer region R1-2B at a location having relatively larger layer thicknesses and a correspondingly lower reflectance. At the second deflection mirror, although the same steel also impinges on a position XFP1" displaced by the displacement distance DIS, the ray "sees" there the same layer system as in the case of the neutral position of the deflection mirrors, with the result that the reflectivity at the second deflection mirror FM2 does not change. Overall, on account of the change in the reflectivity at the first deflection mirror, there arises a change in the total transmission for the rays emerging from the associated object field point.

In contrast to the embodiment from FIG. 3 or FIG. 4, however, such transmission changes arise only for those field points for which a displacement by the displacement distance DIS has the effect that the associated ray "sees" at one of the deflection mirrors after the displacement a different layer system compared with before the displacement. Those field points which lie for example in proximity to the field centre (x=0) remain uninfluenced by the displacement. For the exemplary layer system, overall there arises the change—discernible with reference to FIG. 5D—in the profile of the total transmission T over the image field in the x-direction. The solid line I corresponds to the transmission profile in the image field if the deflection mirrors are situated in the first position (neutral position). The dashed line II arises after a displacement by a displacement distance of 2.5 mm, and the dotted line III arises after a displacement by a displacement distance of 5 mm. It can be discerned that only narrow regions in proximity to the narrow field edges are altered with regard to their transmission by the displacement of the reflective manipulator. This becomes particularly clear from the normalized illustration in FIG. 5E, where, instead of the absolute values T of the transmission, the relative transmission $T_{REL}$ normalized to the transmission values of the neutral position (displacement DIS=0 mm) is plotted on the ordinate.

As a result of displacement, the second layer regions provided with a layer thickness tilt are inserted in the optically used regions and, as a result, the imaging is manipulated in the region of the field edge. It can be discerned that it is possible to alter the transmission at the field edge. The movement distance required for a specific transmission change can be determined in a simple manner. In general, the size of the movement distance lies in the size range of that edge region which is intended to be manipulated. As a result, the movement distance normally varies in the range of a few millimeters.

Figure 6A:
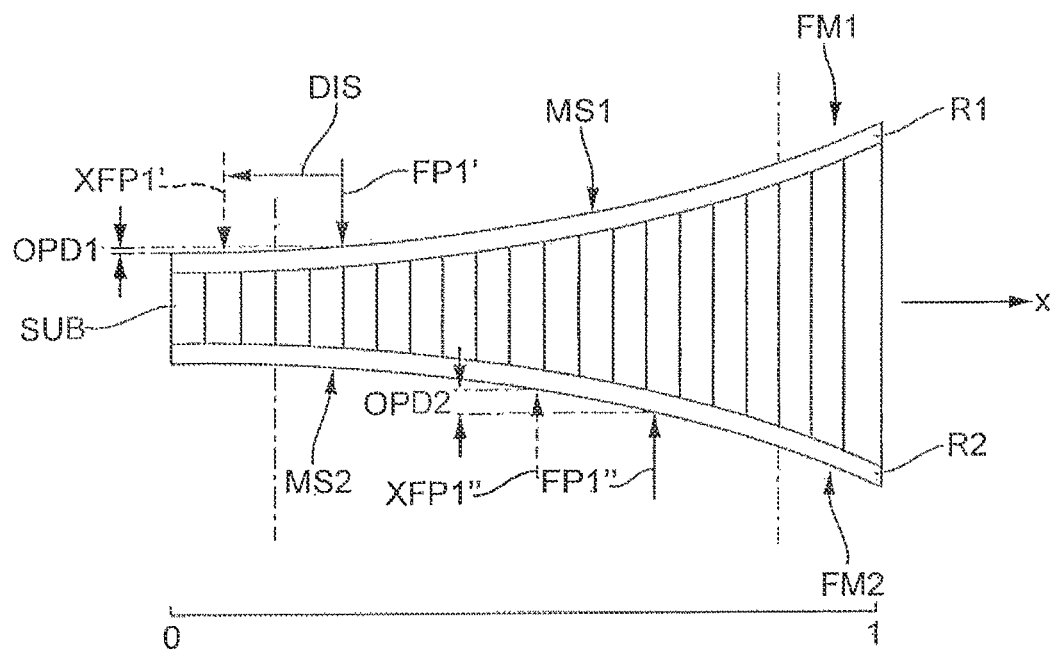
FIG. 6 shows schematically in 6A the construction and the function of an exemplary embodiment wherein the two deflection mirrors have complementary, non-linearly curved mirror surfaces according to a parabolic surface profile in x-direction and in 6B a resulting optical path difference as a function of a displacement of the mirrors.

With reference to FIG. 6A, an explanation will now be given of an exemplary embodiment wherein the first deflection mirror FM1 has a first, non-planar mirror surface MS1 and the second deflection mirror FM1 has a second non-planar mirror surface MS2 having a surface form in the opposite direction to the first mirror surface relative to the first direction (x-direction). In this case, the conditions are shown in a greatly exaggerated manner in the figure of the drawing. Both mirror surfaces MS1, MS2 are curved parabolically in the first direction (x-direction), whereas they are not curved in the directions which are perpendicular thereto and which lie in the mirror surface. This may be denoted as a one-dimensionally curved mirror surface. On both mirror surfaces there is a quadratic profile of the surface in the x-direction, which runs proportionally to $x^2$ at the first deflection mirror and in the opposite direction (or, relative to the first direction, mirror-symmetrically with respect thereto) namely proportionally to $-x^2$, at the second deflection mirror. In the illustration in FIG. 6A, the mirror surfaces (or their lines of intersection with the plane of the drawing) are mirror-symmetrical with respect to the x-direction. When considered three-dimensionally, the mirror surfaces MS1 and MS2 in the exemplary embodiment are mirror-symmetrical with respect to a plane of symmetry spanned by the first direction (x-direction) and that part of the optical axis OA which runs coaxially with the concave mirror. It should be taken into account that, in this example, the spatial coordinate x varies from 0 (at the "left" mirror edge) to 1 (at the "right" mirror edge) or generally from $x_{min}$ to $x_{max}$. Each of the mirror surfaces has a reflection coating R1 or R2, which is constant over the entire mirror surfaces in the case of the example.

With this reflective manipulator the intention is principally to influence the form of the wavefront of a reflected projection radiation beam by virtue of the optical paths of different rays of the projection radiation beam changing differently upon the displacement of the two deflection mirrors in the x-direction.

In the neutral position of the deflection mirrors (first position), a ray coming from the field point FP1 would impinge on the locations—identified by solid arrows—FP1' at the first deflection mirror FM1 and FP1" at the second deflection mirror FM2. The length of the optical path OP between the reflections at the first deflection mirror and at the second deflection mirror is determined by the form of the mirror surface. If the mirror pair FM1, FM2 is then displaced by the displacement distance DIS synchronously in the x-direction, the same ray then impinges on the position XFP1'—identified by a dashed arrow—at the first deflection mirror FM1, the position, on account of the curvature of the mirror surface, lying somewhat further away from the object field than the impingement point FB1 before the displacement. The optical path length difference OPD1 that occurs at the first deflection mirror is illustrated schematically. At the second deflection mirror FM2, the displacement likewise results in a change in the position of the reflection location along the ray path of the ray considered. In this case, however, the two impingement points of the ray before the displacement (FP1") and after the displacement (XFP1") are situated in the region of greater curvature of the mirror surface, such that as a result of the displacement in the region of the second reflection an optical path difference OPD2 arises which is greater than the associated optical path length difference OPD1 at the first deflection mirror. For the ray, therefore, an optical path length difference $\Delta OPD=OPD2-OPD1$ arises overall as a result of the displacement of the deflection mirrors. For field points which lie at other locations of the mirror surfaces as seen in the x-direction, other optical path length differences generally arise on account of the non-linear surface profile, with the result that overall a deformation of the wavefront arises for the field points contributing to the projection radiation beam.

Figure 6B:
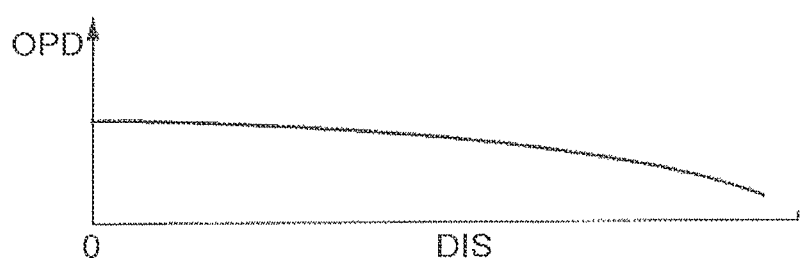

As a result, the optical path difference OPD may be varied as a function of the displacement for each ray, as schematically shown in FIG. 6B. The non-planar topography of the mirror surfaces may be designed such that the amount of change generated by the displacement is different for different field points such that a field dependent variation of optical path difference is obtained.

Another example of a purely reflective wavefront manipulator is now explained in connection with FIG. 7. The basic principles of operation are similar to those explained in connection with the embodiment of FIG. 6. In the example, the different surface shape of the first and second non-planar mirror surfaces MS1, MS1 are adapted to compensate for a specific type of non-rotationally symmetric wavefront aberration sometimes generated during operation of a projection exposure apparatus.

As projection radiation passes through a projection objective, optical components, such as lenses or mirrors, may be heated by the radiation in a non-rotationally symmetric way. Optical components arranged optically near to a field plane, such as the object plane, the image plane or an intermediate image plane of a projection objective, may be particularly affected by non-uniform heating. As the result, an anamorphic distortion of the wavefront may occur. An anamorphic distortion may be considered as a special variant of a field-variable (field-dependent) distortion, i.e. a distortion where the amount and/or direction of distortion varies across the field. Where anamorphic distortion occurs, the optical system effectively has a different power or a different magnification in differently oriented planes containing the optical axis. For example, an optical element which is astigmatically deformed may cause an effective distortion in a radially inward direction in a first direction perpendicular to the optical axis, and an effective distortion in a radially outward direction in a second direction perpendicular to the first direction and the optical axis.

Where an exposure apparatus operates in a scanning operation, with a scanning direction aligned parallel to a y-direction, such distortion pattern leads to a scan-integrated distortion where the displacements in this scanning direction (y-direction) will generally compensate each other to a certain degree, but may be smeared out in the y-direction. In contrast, the scanning process cannot compensate for distortion components in the x-direction. While the distortion in x-direction could be compensated for by changing the magnification slightly using a magnification-manipulator, a residual error typically remains, which residual error is known as "Fading" in the art. The term "Fading" describes a field-dependent distortion of a structure. Where Fading occurs, structural features will be imaged on the average at their correct expected position, but the structures will be imaged with reduced contrast. Fading typically occurs during a scanning operation where a structure to be imaged on a substrate appears to oscillate (i.e. move back and forth) due to the field-dependent distortion in the scanning direction (y-direction) as well as in the cross-scanning direction (x-direction). Such oscillations may lead to a loss in contrast.

The example of a reflective manipulator described in connection with FIG. 7 is effective to correct anamorphic distortions without inducing a loss in contrast. This is achieved by designing the non-planar reflective surfaces of the mirrors such that a tilt of the wavefront in the x-direction (cross-scan direction) is generated, where the amount of tilt depends on the spatial x-coordinate. This particular type of distortion, in combination with an adjustment of the overall magnification, allows correcting anamorphism without fading.

Where a deviation of a real wavefront from a spherical reference wave is described by Zernike polynomials, the distortions in y- and x-direction may be described by Zernike coefficients Z3 for the distortion in y-direction and Z2 for the distortion in x-direction.

Figure 7A:
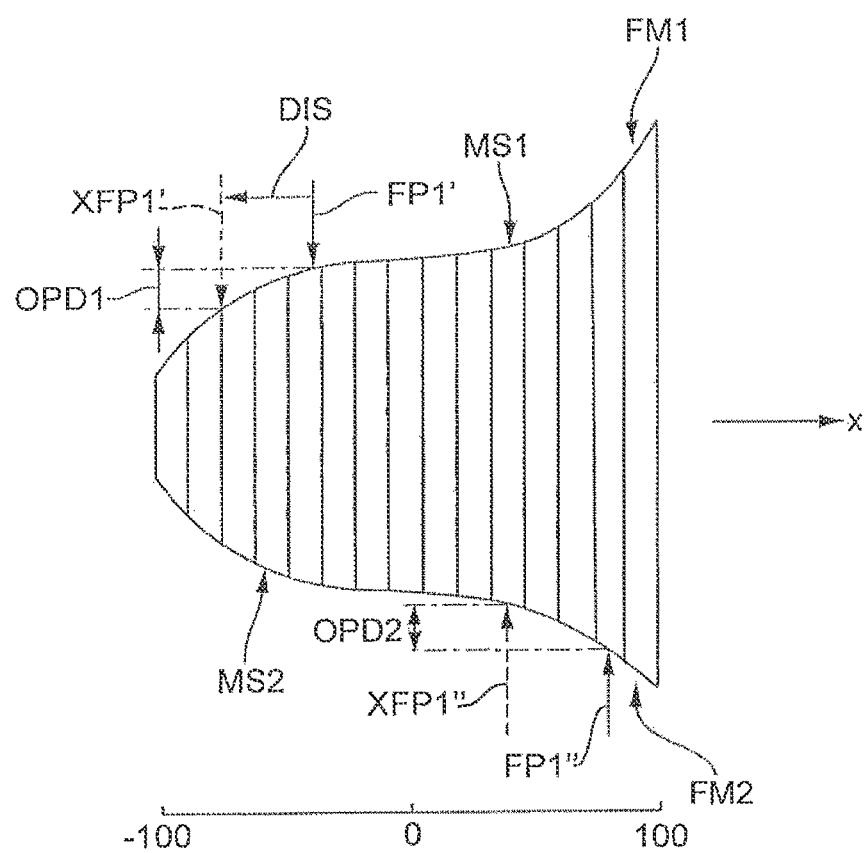
FIG. 7 shows schematically in 7A the construction and the function of an exemplary embodiment wherein the two deflection mirrors have complementary, non-linearly curved mirror surfaces according to a cubic surface profile in x-direction, in 7B a diagram with Zernike coefficient Z2 (wavefront tilt in x-direction) on the y-axis and the field coordinate x [mm] on the x-axis for a displacement of DIS=2 mm, and in FIG. 7C the dependency of the Zernike coefficient Z2 from the displacement DIS [mm] for a field point at x=52 mm.

In the embodiment of FIG. 7A the first mirror surface MS1 of the first folding mirror FM1 has a non-planar surface shape according to a cubic surface profile function in x-direction and a constant profile function in y-direction. The mirror surface is continuously curved only in one dimension (one-dimensional curvature). While y=constant for each position along the x-direction, the surface profile in x-direction is given by $0.1 \, (x/100)^3$, with x given in [mm] With the origin (x=0) positioned half way between the outer edges of the optically used area in x-direction, this corresponds to a complexly curved shape, with a positive curvature of the mirror surface in a first surface portion from the origin towards negative x-values and a negative curvature in a second surface portion from the origin towards positive x-values. In other words, the mirror surface has convexly as well as concavely curved surface portions next to each other in an overall continuously curved mirror surface.

The non-planar surface profile of the reflective first mirror surface MS1 introduces a change of the shape of wavefront of a projection beam incident on the first mirror surface. As a change of the wavefront shape by the folding mirror is not desired when the folding mirror is in the neutral position (without displacement), a compensation of the change of the wavefront introduced by the first mirror surface MS1 is normally desired. Such compensation may be accomplished by a corresponding correction element at or near a position optically conjugate to the position of the first folding mirror FM1. The compensation may be effected by one or more refractive optical elements upstream and/or downstream of the first folding mirror. In the embodiment schematically shown in FIG. 7A the effect of the first folding mirror in the neutral position is compensated by a corresponding complementary shape of the second mirror surface MS2 of the second folding mirror FM2, which is situated in a position optically conjugate to the first folding mirror FM1. In this embodiment, the second mirror surface MS2 and the first mirror surface MS1 are shaped mirror-symmetrically with respect to a plane of symmetry spanned by the first direction (x-direction) and that part of the optical axis OA which runs coaxially with the concave mirror. Due to this symmetry, the second mirror surface MS2 effectively compensates for changes of the incident wavefront generated by the complexly curved first mirror surface MS1 when the mirror surfaces are in the neutral position (first position).

The mutual compensation of the respective effects of the curved first and second mirror surfaces MS1, MS2 present in the neutral position of the deflecting mirrors is no longer effective if the deflecting mirrors are displaced along the x-direction. Instead, a residual effect on the wavefront remains for each finite value of the displacement DIS. In other words: displacing the first and second folding mirrors along the x-direction generates a deformation of the wavefront defined by the respective surface shapes of a folding mirror and by the amount of displacement.

In order to demonstrate the effect quantitatively, the effect of the cubic deformation of a mirror surface (according to $0.1 \, (x/100)^3$) has been calculated for a projection objective having the specification of the fifth embodiment disclosed in WO 2004/019128. The respective disclosure of this publication is incorporated herein by reference. The calculation was performed for a first mirror surface curved as described, assuming that a full correction of the optical effect of the curved surface in the neutral position is achieved by suitable mechanism in an optically conjugate position.

Figure 7B:
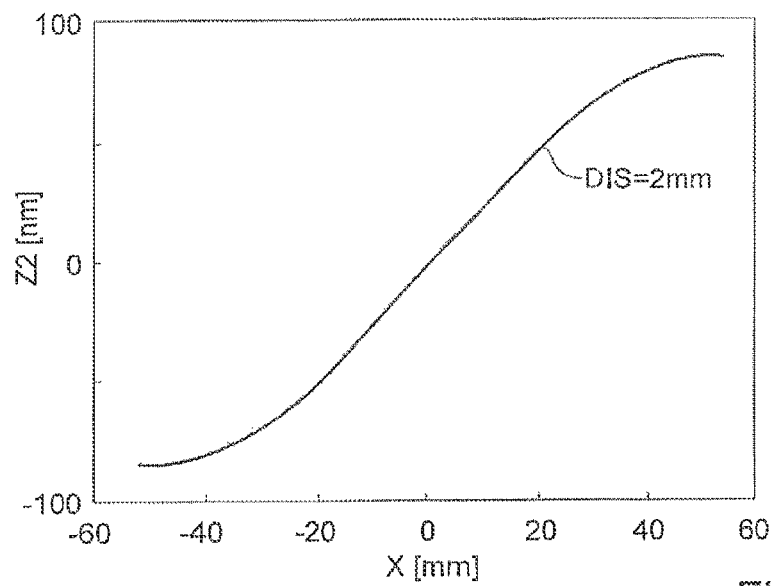
Figure 7C:
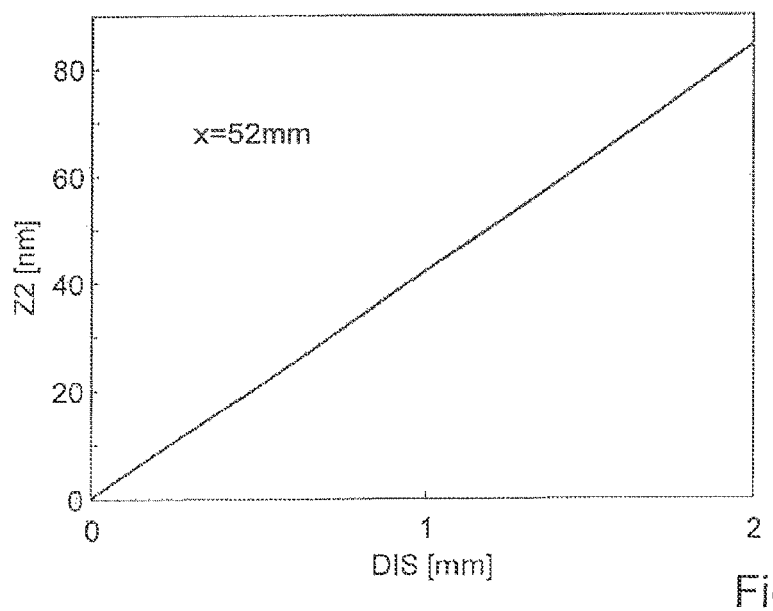

FIGS. 7B and 7C illustrate the effects of a displacement of the purely reflective manipulator (formed by the two folding mirrors FM1, FM2) on the Zernike coefficient Z2, which represents the tilt component of the wavefront in x-direction. FIG. 7B shows a diagram where the Zernike coefficient Z2 is shown on the y-axis and the field coordinate x [mm], i.e. the position of a field point in the x-direction is given on the x-axis. The values are calculated for the finite displacement of DIS=2 mm. FIG. 7C shows the dependency of the Zernike coefficient Z2 from the displacement DIS [mm] for a field point at the edge of the field at x=52 mm.

As seen in FIG. 7C, a strictly linear dependency of the wavefront tilt in x-direction (represented by Z2) from the amount of displacement is obtained. In the neutral position of the folding mirrors (DIS=0) no wavefront tilt in the x-direction is generated (Z2=0). As the displacement is increased, the tilt of the wavefront in x-direction is linearly increased. FIG. 7B basically shows the field-dependence of the effect obtained by the displacement. The curve in FIG. 7B is calculated for a finite displacement of 2 mm. There is no effect of the displacement for the center of the image field at x=0 because Z2=0 for x=0. The wavefront tilt increases largely linearly as the distance from the origin (x=0) is increased towards positive values, and decreases linearly as the distance is increased towards negative values. It is seen that the effect is largely linear in a wide range around the origin of the field with some deviation from linearity towards the outer edges of the field in the x-direction.

The gradient (or slope) of the curve in FIG. 7B is smaller for smaller displacement values and larger for larger displacement values. Providing a second mirror surface with complementary surface profile (see e.g. FIG. 7A) as a correction mechanism effective in the neutral position results in an additional advantage that the displacement is effectively doubled because, in optical terms, the mirrors are relatively displaced in mutually opposite directions. In other words: smaller absolute displacements are required to achieve a desired amount of correction.

The quantitative example shows that the reflective manipulator allows influencing the wavefront tilt in the x-direction in a targeted manner due to the complex shape of the curved mirror surfaces. If a surface profile basically corresponding to the cubic profile of the example is chosen, a largely linear dependency of the tilt on the displacement (FIG. 7C) and of the tilt from the image point position may be obtained, which may be advantageous in many cases. However, the surface profile of the mirror surfaces may significantly deviate from the cubic profile (FIG. 7) or the parabolic profile (FIG. 6). Higher order deformation may be desirable to optimize the reflective manipulator for other correction purposes. The term "higher order deformations" generally refers to deformations which may be described by higher order polynomials, where the surface profile in x-direction is a function of the x-coordinate and the polynomial includes terms with $x^k$, where k>3. For example, k may be 4 or 5 or 6 or higher. For example, a polynomial may include terms like $bx^3+ax^4$ . . . etc. The amount of surface deformation is not limited to those of the examples. In general, the required displacements may be smaller if the absolute amount of surface deformation is selected larger and vice versa.

The form and magnitude of the deformation are dependent firstly on the respective surface forms of the two deflection mirrors and secondly on the extent of the displacement in the x-direction. The wavefront effect changes as a result of the displacement of the mirrors. In general, a certain wavefront effect of the two deflection mirrors is also present in the neutral position (first position). However, this contribution can be predicted and thus compensated for by corresponding configuration of the other optical elements of the projection objective. Since this compensation is fixed, it no longer functions in the event of a displacement of the deflection mirrors, such that an alteration of the wavefront results when the manipulator is actuated. The movement distance DIS of the deflection mirrors is generally significantly smaller in the case of a manipulation of the wavefront than in the case of the above-described manipulators for influencing the radiation energy distribution. Typical movement distances can be in the range of one or several micrometers, for example in the range of 10 micrometers or more, or 100, 200, 400, 600 micrometers or more. The displacement distances are often not larger than approximately 1 mm.

For further clarification it should also be mentioned that, as a result of a displacement of the deflection mirrors, there would be no change to the imaging performance of a projection objective if the deflection mirrors were conventional, planar deflection mirrors in conventional reflection coatings having a reflectance substantially constant over the optically usable surface. An influence of the displacement and thus a field-dependent manipulation of the imaging of the optical system can only be achieved by the use of special deflection mirrors that have been explained here on the basis of some examples.

In the case of the projection objective in the exemplary embodiment, the imaging scale $\beta_x$ in the first direction is very close to −1, namely $\beta_x$=−1.01. A correction effect can also be achieved, in principle, if the imaging scale $\beta_x$ deviates more greatly from −1. In general, an effective correction with sufficient resolution in the field is readily possible if the optical imaging system arranged between the first field plane and the second field plane has in the first direction an imaging scale $\beta_x$ from the range −0.8>$\beta_x$>−1.2, where the condition −0.9>$\beta_x$>−1.1 should preferably be met in order that, upon synchronous displacement of the deflection mirrors by identical displacement distances, even field points that are close together can be influenced in a targeted manner largely independently of one another.

The invention claimed is:

1. A projection objective configured to image an object field into an image field, the projection objective comprising:
   a multiplicity of lenses;
   a concave mirror;
   a first deflection mirror in optical proximity to a first field plane of the projection objective, the first deflection mirror configured to deflect radiation from the object field to the concave mirror;
   a second deflection mirror in optical proximity to a second field plane of the projection objective, the second deflection mirror configured to deflect radiation from the concave mirror to the image field, wherein:
   the second field plane is optically conjugate to the first field plane;
   relative to an optical axis of the projection objective, the first deflection mirror is tilted about an axis perpendicular to the optical axis and parallel to a first direction;
   relative to the optical axis of the projection objective, the second deflection mirror is tilted about an axis perpendicular to the optical axis and parallel to the first direction;
   the first deflection mirror is displaceable parallel to the first direction between first and second positions; and
   the second deflection mirror is displaceable parallel to the first direction between first and second positions.

2. The projection objective of claim 1, wherein the projection objective comprises an optical imaging system configured to image the first field plane into the second field plane, and the optical imaging system comprises the concave mirror.

3. The projection objective of claim 2, wherein the first field plane is associated with a first intermediate image of the projection objective, and the second field plane is associated with a second intermediate image of the projection objective.

4. The projection objective of claim 2, wherein the optical imaging system has an imaging scale between 0.8 and 1.2.

5. The projection objective of claim 1, wherein during use of the projection objective:
   radiation passes from the object field to the image field to image the object field into the image field;
   when the first deflection mirror is in its first position, the radiation impinges on a first reflection region of the first deflection mirror;
   when the first deflection mirror is in its second position, the radiation impinges on a second reflection region of the first deflection mirror; and
   the second reflection region of the first deflection mirror is offset from the first reflection region of the first deflection mirror in a direction parallel the first direction.

6. The projection objective of claim 5, wherein a distribution of reflectivity of the first reflection region of the first deflection mirror is different from a distribution of reflectivity of the second reflection region of the first deflection mirror.

7. The projection objective of claim 5, wherein a reflection coating of the first deflection mirror has a thickness that changes linearly in a direction parallel to the first direction.

8. The projection objective of claim 5, wherein a reflectivity of the first reflection region of the first deflection mirror is constant, and a thickness of a reflection coating of the first deflection mirror is non-constant in the second reflection region of the first deflection mirror.

9. The projection objective of claim 5, wherein during use of the projection objective:
   when the second deflection mirror is in its first position, the radiation impinges on a first reflection region of the second deflection mirror;
   when the second deflection mirror is in its second position, the radiation impinges on a second reflection region of the second deflection mirror; and
   the second reflection region of the second deflection mirror is offset from the first reflection region of the second deflection mirror in a direction parallel to the first direction.

10. The projection objective of claim 1, wherein:
    the first deflection mirror has a non-planar mirror surface having a surface form in a direction parallel to the first direction;

the second deflection mirror has a non-planar mirror surface having a surface form in a direction parallel to the first direction; and the surface form of the second deflection mirror is opposite to the surface form of the first direction in a direction parallel to the first direction.

11. The projection objective of claim 10, wherein the surface form of the first deflection mirror deviates from a planar surface by less than 10 μm, and the surface form of the second deflection mirror deviates from a planar surface by less than 10 μm.

12. The projection objective of claim 1, wherein:

a mirror surface of the first deflection mirror has a profile in a direction parallel to the first direction; and the profile of the mirror surface of the first deflection mirror is selected from the group consisting of a parabolic surface profile, a cubic surface profile, a surface profile following a polynomial, and a profile with a positive curvature of the mirror surface in a first surface portion and a negative curvature in a second surface portion offset from the first surface portion.

13. The projection objective of claim 12, wherein:

a mirror surface of the second deflection mirror has a profile in a direction parallel to the first direction; and the profile of the mirror surface of the second deflection mirror is selected from the group consisting of a parabolic surface profile, a cubic surface profile, a surface profile following a polynomial, and a profile with a positive curvature of the mirror surface in a first surface portion and a negative curvature in a second surface portion offset from the first surface portion.

14. The projection objective of claim 1, wherein the first deflection surface is disposed at a location within the projection objective having a subaperture ratio of less than 0.3, and the second deflection surface is disposed at a location within the projection objective having a subaperture ratio of less than 0.3.

15. The projection objective of claim 1, further comprising a device configured to displace the first and second deflection mirrors parallel to the first direction.

16. The projection objective of claim 15, wherein the device comprises a drive to synchronously displace the first and second deflection mirrors parallel to the first direction, and the drive is actuable during use the projection objective.

17. The projection objective of claim 1, wherein the first and second deflection mirror are synchronously displaceable parallel to the first direction.

18. The projection objective of claim 1, further comprising a carrier structure that supports both the first and second deflection mirrors.

19. The projection objective of claim 1, wherein the projection objective comprises a prism, and the first and second deflection surfaces define perpendicularly oriented surfaces of the prism.

20. The projection objective of claim 1, wherein the projection objective comprises:

a first objective part configured to image the object plane into a first intermediate image;

a second objective part configured to image the first intermediate image into a second intermediate image; and a third objective part configured to image the second intermediate image into the image surface, and wherein:

the concave mirror is in a region of a pupil surface between the first and the second intermediate images;

the first deflection mirror is in optical proximity to the first intermediate image; and the second deflection mirror is in optical proximity to the second intermediate image.

21. The projection objective of claim 1, wherein the projection objective comprises:

a first objective part configured to image the object plane into an intermediate image; and a second objective part configured to image the intermediate image into the image surface, and wherein:

the concave mirror is in a region of a pupil surface between the object field and the intermediate image;

the first deflection mirror is in optical proximity to the object field; and the second deflection mirror is arranged in optical proximity to the intermediate image.

22. An apparatus, comprising:

a projection objective according to claim 1; and an illumination system configured to illuminate the object field of the projection objective, wherein the apparatus is a projection exposure apparatus.

23. A method of using a projection exposure apparatus comprising an illumination optical unit and a projection optical unit, the method comprising:

using the illumination optical unit to illuminate structures of a reticle in an object plane of the projection optical unit; and using the projection optical unit to project at least some of the illuminated structures of the reticle onto a light-sensitive material in an image plane of the projection optical unit, wherein the projection optical unit is a projection objective according to claim 1.

* * * * *

UNITED STATES PATENT AND TRADEMARK OFFICE
CERTIFICATE OF CORRECTION

PATENT NO. : 9,274,327 B2
APPLICATION NO. : 14/522917
DATED : March 1, 2016
INVENTOR(S) : Thomas Schicketanz and Toralf Gruner It is certified that error appears in the above-identified patent and that said Letters Patent is hereby corrected as shown below:

Title Page, item (71), Col. 1, line 1 (under title), delete "Oberkcohen" and insert --Oberkochen--.

In the Specification

Col. 10, line 47, delete "coherence a" and insert --coherence $\sigma$--.

Col. 18, line 5, after "with", insert --$H_i$,--.

Signed and Sealed this
Twenty-sixth Day of July, 2016

Michelle K. Lee
*Director of the United States Patent and Trademark Office*